(12) United States Patent
Drakulich

(10) Patent No.: US 10,604,953 B2
(45) Date of Patent: Mar. 31, 2020

(54) MODULAR PROJECTION SYSTEMS, ENCLOSURES AND WELLNESS STUDIOS

(71) Applicant: Nicole Drakulich, Los Angeles, CA (US)

(72) Inventor: Nicole Drakulich, Los Angeles, CA (US)

( * ) Notice: Subject to any disclaimer, the term of this patent is extended or adjusted under 35 U.S.C. 154(b) by 0 days.

(21) Appl. No.: 16/401,354

(22) Filed: May 2, 2019

(65) Prior Publication Data
US 2019/0264456 A1    Aug. 29, 2019

Related U.S. Application Data

(63) Continuation of application No. 16/252,948, filed on Jan. 21, 2019, which is a continuation of application (Continued)

(51) Int. Cl.
*G03B 21/28* (2006.01)
*E04H 1/12* (2006.01)
(Continued)

(52) U.S. Cl.
CPC ....... *E04H 1/1205* (2013.01); *A63B 24/0075* (2013.01); *A63B 71/02* (2013.01); *E04H 3/14* (2013.01); *E04H 3/22* (2013.01); *G03B 21/00* (2013.01); *G03B 37/00* (2013.01); *G03F 5/02* (2013.01); *G02B 7/183* (2013.01)

(58) Field of Classification Search
CPC ........ G03B 21/28; G03B 37/00; G03B 21/56; A63J 5/021; H04N 5/222; H04N 9/3147; E04H 3/22
See application file for complete search history.

(56) References Cited

U.S. PATENT DOCUMENTS 3,487,595 A * 1/1970 Schumann ................ E04H 3/10
52/8
3,776,621 A * 12/1973 Worland ................ G02B 27/06
352/85
(Continued)

FOREIGN PATENT DOCUMENTS

KR    20140026095 A    3/2014

OTHER PUBLICATIONS

McQuarrie, Laura, 'Yogascape' Classes at Earth's Power Yoga Blend Technology and Yogahttps://www.trendunter.com/trends/technology-and-yoga.
(Continued)

*Primary Examiner* — Gisele D Ford
(74) *Attorney, Agent, or Firm* — Carlos A. Fisher; Stout, Uxa & Buyan, LLP

(57) ABSTRACT

Methods and compositions for creating an immersive experience within wellness studios, rooms and enclosures, and methods of physically organizing a wellness center or studio and conducting the business of a wellness center or studio. In some embodiments the invention concerning enclosures for conducting wellness activities, such as yoga, pilates, meditation and the like. In preferred embodiments the enclosure comprises at least one interior space and at least one mirrored wall that reflects images projected from one or more projector component into a curved, projection wall opposing the mirrored wall.

9 Claims, 13 Drawing Sheets

Related U.S. Application Data

No. 16/184,213, filed on Nov. 8, 2018, now abandoned.

(60) Provisional application No. 62/583,236, filed on Nov. 8, 2017.

(51) Int. Cl.
| | |
|---|---|
| *E04H 3/14* | (2006.01) |
| *G03F 5/02* | (2006.01) |
| *G03B 37/00* | (2006.01) |
| *E04H 3/22* | (2006.01) |
| *G03B 21/00* | (2006.01) |
| *A63B 24/00* | (2006.01) |
| *A63B 71/02* | (2006.01) |
| *G02B 7/183* | (2006.01) |

(56) References Cited

U.S. PATENT DOCUMENTS

| | | | | |
|---|---|---|---|---|
| 5,433,670 | A * | 7/1995 | Trumbull | A63G 31/16 352/85 |
| 5,964,064 | A * | 10/1999 | Goddard | A63J 5/021 352/43 |
| 6,126,551 | A | 10/2000 | Martin | |
| 6,164,018 | A * | 12/2000 | Runge | E04H 3/22 52/174 |
| 6,253,494 | B1 * | 7/2001 | Shaffron | E04H 3/22 52/64 |
| 6,646,800 | B2 * | 11/2003 | Choi | G03B 21/56 352/69 |
| 6,665,985 | B1 * | 12/2003 | Hennes | E04H 3/22 352/69 |
| 6,865,023 | B2 * | 3/2005 | Shafer | G09F 19/18 353/122 |
| 7,204,763 | B2 * | 4/2007 | Beynon | A63B 19/10 472/90 |
| 7,911,580 | B2 * | 3/2011 | Read | E04H 3/22 352/11 |
| 7,980,858 | B2 * | 7/2011 | Valoe | E04H 3/08 434/432 |
| 9,380,682 | B2 | 6/2016 | Mead et al. | |
| 9,797,151 | B2 * | 10/2017 | Sallent Puigcercos | E04H 3/30 |
| 10,096,160 | B2 * | 10/2018 | Choi | G06T 19/003 |
| 10,139,721 | B1 * | 11/2018 | Choi | G03B 35/22 |
| 2004/0000099 | A1 | 1/2004 | Gal | |
| 2010/0190610 | A1 * | 7/2010 | Pryor | A63B 71/06 482/8 |
| 2010/0218435 | A1 | 9/2010 | Reeves | |
| 2011/0211174 | A1 * | 9/2011 | Curtis | G03B 21/28 353/80 |
| 2012/0079555 | A1 * | 3/2012 | Choi | G09B 19/0015 725/139 |
| 2012/0188513 | A1 * | 7/2012 | Choi | H04N 9/3147 352/59 |
| 2012/0247030 | A1 * | 10/2012 | Magpuri | E04H 3/22 52/6 |
| 2012/0287407 | A1 * | 11/2012 | De Paor | G03B 21/56 353/30 |
| 2014/0235362 | A1 * | 8/2014 | Fox | H04N 13/363 472/75 |
| 2014/0333899 | A1 * | 11/2014 | Smithwick | G02B 21/00 353/10 |
| 2015/0114439 | A1 | 4/2015 | Henderson et al. | |
| 2016/0059105 | A1 | 3/2016 | Scade Garcia | |
| 2016/0112691 | A1 * | 4/2016 | Bert | G03B 21/602 348/750 |
| 2016/0239624 | A1 | 8/2016 | Short et al. | |
| 2018/0139420 | A1 * | 5/2018 | Liu | G03B 21/60 |
| 2018/0256991 | A1 * | 9/2018 | Matson | A63J 11/00 |
| 2019/0025578 | A1 * | 1/2019 | Boffi | G03B 21/28 |
| 2019/0064647 | A1 * | 2/2019 | Orsley | G03B 21/56 |

OTHER PUBLICATIONS

Jacobs, Sarah, "A Successful entrepenuer opened a new meditation studio in NYC to cash in on a $1billion market", https://www.businessinsider.com/intermix-founder-opens-meditation-studio-in-nyc-2017-2/.

Thomas, Frank, "The Edge of Fitness", http://www.gameplan-a.com/2014/08/the-edge-of-fitness/.

Nowakowski, Audrey, "Fit for You:Virtual Fitness", http://wuwm.com/post/fir-you-virtual-fitness.

International Search Report application No. PCT/US18/59794, dated Feb. 7, 2019.

\* cited by examiner

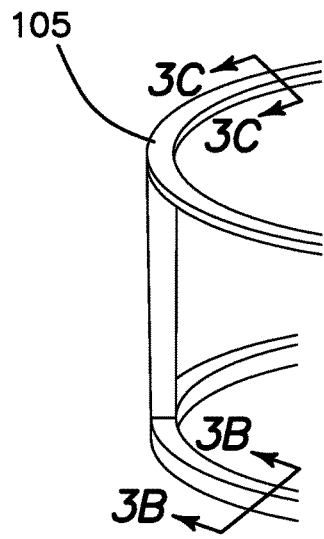
FIG. 3A
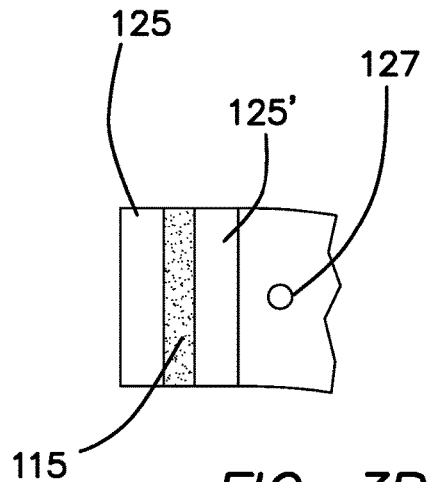
FIG. 3B
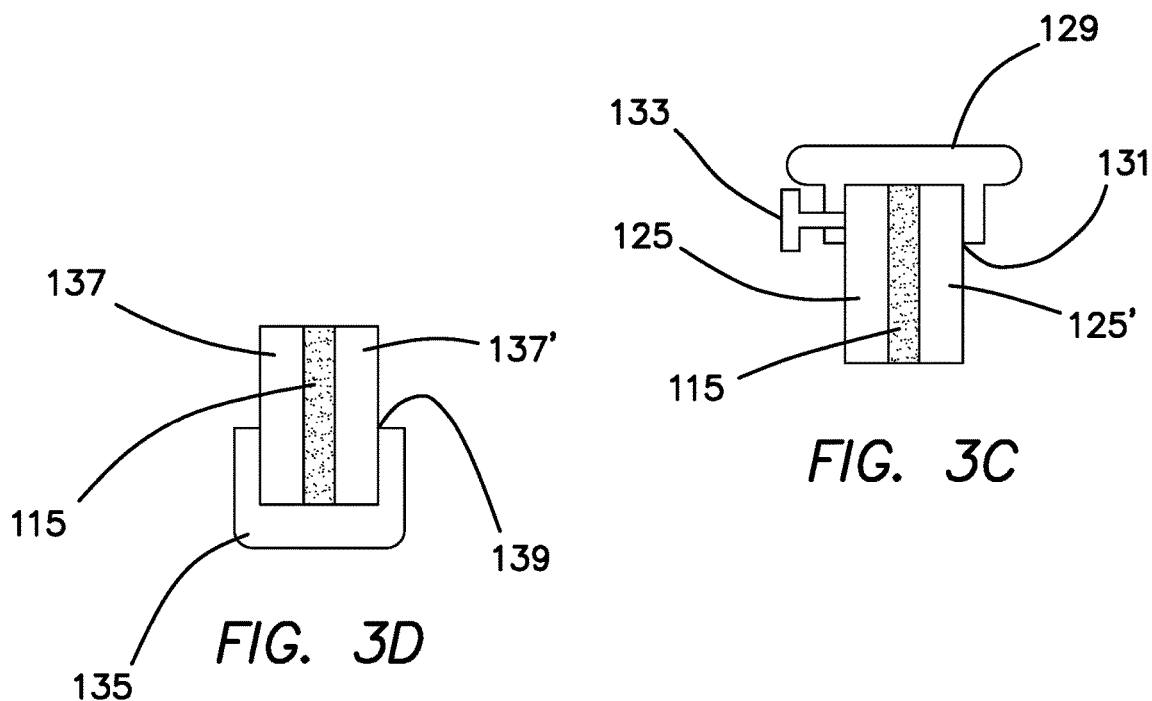
FIG. 3D
FIG. 3C

MODULAR PROJECTION SYSTEMS, ENCLOSURES AND WELLNESS STUDIOS

CROSS-REFERENCE TO RELATED APPLICATIONS AND PATENTS

This application is a continuation of U.S. patent application Ser. No. 16/252,948, filed Jan. 21, 2019, which was a continuation of U.S. patent application Ser. No. 16/184,213, filed Nov. 8, 2018, which claimed the benefit of U.S. Provisional Application Ser. No. 62/583,236, filed Nov. 8, 2017, each of which is hereby incorporated by reference herein in its entirety.

FIELD OF THE INVENTION

In some examples the present invention is useful, without limitation, in the field of fitness and fitness classes such as yoga, pilates, stationary cycling, such as SPIN® type classes, as well as in meditation and devotional classes. In other examples or aspects of the invention, the invention may be associated with the visual arts, providing a wide screen, preferably an encompassing visual projection experience, in which one or more of a light, photographic, graphic, film, or video image may be projected so as to surround the viewer.

BACKGROUND AND SUMMARY OF THE INVENTION

The human concern with physical fitness is as old as prehistory, when hunting for food required the ability to run long distances and enough physical strength to overcome prey, and when conflict with neighbors over food and other natural resources was often decided according to the maxim "survival of the fittest".

Even after most humans no longer had to depend on strength to survive in the wild, a concern for fitness persisted into the earliest civilizations. The ancient Greeks formed public institutions called "gymnasiums" where young men received training in physical exercises, wrestling, boxing and ball games, and schooling in philosophy.

In China, the philosophical teachings of Confucius encouraged participation in regular physical activity. It was recognized by the ancient Chinese that physical inactivity was associated with certain diseases (referred to as organ malfunctions and internal stoppages, which sound similar to heart disease and diabetes) that were preventable with regular exercise for fitness. Cong Fu (called Kung Fu in the West) was subsequently developed as a gymnastic program to keep the body in good, working condition.

In India, yoga was developed first as a system of Hindu philosophy that strives to bring together and personally develop the body, mind, and spirit. Hatha Yoga, the form of yoga with which Westerners are most familiar, is defined by a series of exercises in physical posture and breathing patterns. Ancient Indian philosophers recognized health benefits conferred by yoga including proper organ functioning and whole well-being. Additionally, meditation practices have been used in India and throughout the ancient Far East for thousands of years to calm the mind and provide physical, spiritual and emotional balance to the practitioner.

In the United States, physical fitness has, until relatively recently, been an almost purely physical endeavor, involving sporting activities such as track and field and ball games, competitions such as wrestling and boxing, and weight and stamina training. Also, until recently physical fitness has been a largely male activity in the United States.

Since the 1960's and 1970's a change began to take place in the U.S. and other Western countries, in which each of these two long-standing facts concerning physical fitness has rapidly changed. The introduction of Buddhist and Hindu spirituality and philosophy in the West as part of the "self-awareness" explosions of the 60's has resulted in more and more Americans embracing yoga (hatha yoga), Tai Chi, and meditation practices, as well as Chinese, Japanese and Korean martial arts disciplines such as karate, Kung Fu, each of which has a strong spiritual and/or experiential component.

Furthermore, physical fitness itself has also become a far more common and popular practice in the last 30 years than previously in American history. From 2005 to 2014 alone, the number of gym memberships rose 22%. Furthermore, in 2014 gym membership rates in the U.S. were split roughly 50:50 between men and women. The gym, fitness and health club market is valued at around $27 billion annually in the U.S., while it is valued at about $75 billion world-wide.

Additionally, physical fitness, meditation, spirituality, and holistic medicine are today being practiced together under the umbrella term "wellness". Wellness is a term coined in 1961 by Halbert L. Dunn in his book "High-Level Wellness" to mean "a state of complete physical, mental and social well-being and not merely the absence of disease or infirmity." The so-called Wellness Movement incorporates alternative medicine approaches to holistic health, physical fitness, yoga and meditation in order to attempt for each person to reach their own wellness state.

Wellness centers and studios, in which yoga, physical fitness (such as, without limitation, pilates, martial arts training, stationary bicycling, cardiovascular training and the like) and/or meditation can be taught and practiced are now increasingly common.

Yogis use meditation for their quest to enter "Nirodha", a state of mind that is not distracted by random thoughts but is fully absorbed in the object of focus. In the fitness world athletes have a different name for a similar phenomenon: athletes across a number of sports often refer to "the zone" to describe the desirable mental state in which awareness of time is suspended, and in which a person is performing at peak or optimal ability, a place of focus, achievement and fulfillment.

In order to create an immersive wellness experience some fitness and meditation studios and centers use music, scent, choreography and/or professional instruction to enhance participants' concentration, training and/or practice and to aid them in reaching such a state of mind.

Some fitness studios have included a visual component as well. Thus, one fitness studio combines knowledge of studio fitness with a 360° cinema technology, which can also be used for live music performances. *The Edge of Fitness*, addidias GamePlan A (Aug. 4, 2014) at https://www.gameplan-a.com/2014/08/the-edge-of-fitness/. Participants find themselves surrounded by video content that projects onto three screens of a purposefully built studio. People are immersed in the video content's perfect synchronization with music and the trainer's instructions, and can get into the zone, leaving their day-to-day life behind. Thus, participants taking part in a cycle class may find themselves riding up an impossibly steep glacier or sprinting their way around a digital velodrome. In a dance class they might be experiencing a music festival where everybody is dancing together.

According to one article, a meditation studio in New York, Inscape, contains a meditation dome within the studio. *Intermix Founder Opens Meditation Studio in NYC*, Business Insider (Feb. 18, 2017) at http://www.businessinsiden-com/intermix-founder-opens-meditation-studio-in-nyc-2017-2/. Teachers greet guests in the front lobby area, which is set up like a yoga studio, with books and candles available to purchase, and with lockers and restrooms available in the rear. The meditation dome is entered through doors, and the curved roof of the dome is scalloped with geometrical designs which interface with colored mood lighting. The lighting can be adjusted during the meditation session to enhance the meditation experience. The dome thereby creates a space in which the meditation students can have a fruitful meditation experience without everyday distractions and separate from the outside world.

In a Milwaukee fitness studio, participants can choose from a variety of immersive experiences, such as cycling, kickboxing, yoga, and tai chi on a touch screen. Video images are then projected on a large curved screen using technology developed by Surround Fit and Wellness in conjunction with the Marquette University virtual reality lab. Thus, for example, "instead of running a cycling class in February, you'll be riding through a Hawaiian roadside synchronized with [a virtual] instructor." *Fit For You: Virtual Fitness*, WUWM Milwaukee Public Radio website (May 31, 2017) at http://wuwm.com/post/fit-you-virtual-fitness.

A Los Angeles yoga studio provides classes in which the practitioners pose and stretch amidst digital projections that encompass the entire four walls of a heated room. Images include forests, marine life, and outer space to heighten the practitioner's senses for an immersive yoga experience. *Immersive Yoga Studios*, TrendHunter® webpage at https://www.trendhunter.com/trends/technology-and-yoga.

U.S. Patent Publication No. 2004/0000099 A1 discloses mood regulation enclosures including an interior space to contain a user, a closable aperture and physical barriers to effectively sensorily separate the user from the outside environment; these enclosures can include displays such as cathode ray tube display screens, LCD displays and LED displays.

U.S. Patent Publication No. 2015/0114439 A1 discloses inflatable exercise chambers for performing exercise within.

U.S. Patent Publication No. 2016/0059105 A1 discloses a portable outdoor fitness studio for creating an outdoor workout space.

U.S. Pat. No. 6,126,551 discloses a rink and corridor recreational facility comprising movable partitions.

Korean Patent Publication No. 2014/0026095 discloses an interactive yoga studio for a practitioner to enjoy yoga alone without a lecturer while waiting for a flight in an airport. The studio comprises an output device including a sound system for providing voice guidance or music. The output device may also include a projector and screen for receiving information, which may include a preprogrammed video, from a server and displaying the information on a screen.

Each and every patent, patent publication, and non-patent publication cited in this specification is hereby incorporated by reference as part of the specification in its entirety.

SUMMARY OF THE INVENTION

The present invention is generally directed to wellness studios, rooms and enclosures, and methods of physically organizing a wellness center or studio and conducting the business of a wellness center or studio.

By "wellness" is meant activities including, but not limited to, yoga, holistic medicine, physical fitness (such as, without limitation, pilates, martial arts training, stationary bicycling, cardiovascular training and the like), massage, and/or meditation the practice of which can be enhanced by the practitioner's isolation from the thoughts, sights, and sounds of everyday life.

By "exterior wall" is meant that the wall at least partly defines and surrounds an interior space of the enclosure and has at least one exterior surface facing away from the enclosure.

By "internal wall" is meant that the wall forms a barrier within an interior space of the enclosure and does not have an exterior surface facing away from the enclosure.

In one embodiment the invention may include an enclosure comprising a curved exterior wall comprising a projection surface (usually as the interior surface of an exterior wall) forming at least part of the interior surface or surfaces of the enclosure. Non-limiting examples of the plan view of such enclosures include circular, oval, Cassini oval, elliptical, or "pill shaped" floor plans, or semi-circular, semi-oval, semi-elliptical, semi-Cassini oval, or semi-"pill shaped" floor plans. The enclosures of the present invention may be used as, or in, a wellness, yoga and/or exercise studio. In a plan view, the enclosure has one or more wall segments comprising a mirrored wall and comprises an interior space for participants to practice wellness activities; the interior space is at least partially defined by a substantially opaque, substantially continuous wall having at least one interior surface comprising a curved projection surface for the projection of visual images such as films, photographs, graphics, video and the like.

By "substantially continuous" is meant that a surface is continuous, or is continuous except for wall or surface component junctions, doors or other similar openings, and the like.

By "substantially opaque" is meant that light is not transmitted through an object, or that the object transmits insufficient light for shapes on one side of the object to be identified by a person on the other side of the object.

By "projection surface" is meant any surface effective to display visual images. A projection surface may preferably be designed to avoid discoloration of reflected, projected images. Very preferably the projection surface comprises a reflective surface that may be either aluminized or a white surface with small glass beads (for high brilliance under dark conditions). In some embodiments the projection surface may comprises a LCD or LED screen for the direct projection of images from, for example, a device containing a microprocessor, such as a computer, smartphone, DVD player or other such device.

In some embodiments the enclosure may have a roof. In other embodiments the enclosure may lack a roof. In some embodiments the roof or top portion of the enclosure may be substantially continuous and hemispherical or otherwise curved. In some embodiments part or all of the interior surface of the roof may compromise a projection surface against which one or more generally upward-facing projectors may project visual images such as moving images, photographs, graphics, and the like. In some embodiments these visual images may be part of, or extend, the visual images projected against the curved interior projection surface of the exterior wall.

In a currently preferred embodiment, the enclosure is pill-shaped or elliptical in a plan view, comprising an interior space surrounded by a substantially opaque, substantially continuous, exterior wall. Thus, the exterior wall of the enclosure comprises at least a part of the outline of the "pill" or elliptical plan view shape of the overall enclosure.

The one or more wall segments comprising a mirrored wall comprise two opposing surfaces; in some embodiments each opposing surface is mirrored and the wall segment is an interior wall. In other embodiments, particularly but not exclusively those in which the mirrored wall segment comprises an exterior wall segment, only one opposing surface is mirrored.

For example, in one embodiment a mirrored wall lies between two points on opposing interior surfaces of the exterior wall of the enclosure; if the enclosure is circular, the mirrored wall lies along a chord (such as a diameter) of the circle, and comprises an interior wall. In this embodiment the exterior wall and the interior wall define two interior spaces. In such case, each side (each opposing surface) of the interior mirrored wall may be mirrored.

In another embodiment of the invention, a circular enclosure is defined by a circumferential exterior wall. In this embodiment, three interior mirror walls project from the central point of the interior of the enclosure as radii, and are spaced 120° from each other around the exterior wall, with three interior spaces being defined from two interior walls and the interior surface of the exterior wall. In this embodiment both surfaces of each of the three interior mirrored walls are preferably mirrored.

In is clear to one of ordinary skill that the floor plan and plan view of a circular enclosure may be elongated along one axis to form a capsular, rounded rectangular, or stadium "pill" shape, thus increasing the area of the interior space or spaces.

In another embodiment of the invention, the enclosure may be semicircular in plan view, and comprises a substantially opaque, substantially continuous exterior wall having at least one interior surface comprising a projection surface forming the arc of the semicircle. A mirrored exterior wall forms the baseline of the semicircle, wherein at least the internal surface of the mirrored exterior wall is mirrored. The two exterior walls thus form a semicircular interior space.

In preferred embodiments the invention is drawn to an enclosure, as described herein, and a projector component capable of projecting visual images on a curved projecting surface of the enclosure. As used herein, the term "projector component" means a light source which creates a visual image when the light is projected against a surface; the term means a single projector or an array of projectors. Very preferably, but not always necessarily (as will be seen), the projector component is located approximately equidistant from all, or a majority, of projection surfaces upon which an image is projected. The term "approximately equidistant" means, in this context, sufficiently equidistant so that an image projected against two sections of the projecting surface remains substantially focused in each of these sections without the need to refocus the projector lens.

Thus, in one preferred embodiment, the enclosure has a circular plan view and the projector component is capable of projecting one or more visual image around a 360° projecting surface on the inside surface of an external wall. The projector component is also preferably elevated at a distance of about 7 feet or more, or about 8 feet or more, or about 9 feet or more, or about 10 feet or more, or about 11 feet or more, of about 12 feet or more, or about 13 feet or more, of about 14 feet or more, or about 15 feet or more above the floor of the enclosure. Furthermore, the location of the projector component in a plan view is at or near the center of the circumference of the exterior wall comprising the projecting surface. The projector component may be structured and designed to project "actual" images, such as (without limitation) film, slides, or photographs. Alternatively, or additionally, the projector component may be structured and designed to project "virtual images" such as (without limitation) videotaped images or microprocessor-generated images, such an (without limitation) images contained on a computer, server, hard drive, cellular telephone, tablet device, video recording or playing device, and the like.

In currently preferred embodiments the projector component may comprise an array containing a plurality of linked individual projectors. The number of protectors required can be calculated based on the distance from the projector to the projection surface and the area of the resulting projected visual image. In one embodiment a projector component comprises four individual projectors to project a single coherent, focused, 180° individual image around the circumference of a semicircular interior space (or eight projectors to project an image 360° around a circular interior space. In this embodiment each individual projector may project an image having a size on the projection surface of about 9-10 feet high and about 17 feet wide. The images can be made to overlap, thus creating a virtually seamless single image projected around the 180° semicircular projecting surface of the first interior space.

In this embodiment an interior mirrored wall intersects the center (or approximate center) of the circle in plan view, thus bisecting the circle into two interior spaces having equal semicircular areas bounded by the exterior wall. Preferably, the mirrored interior wall has a mirrored reflecting surface on both interior surfaces of the wall. In this embodiment, when a visual image is projected by the projector component against the 180° semicircular projecting surface of the first interior space, the mirrored surface of the mirrored interior wall causes the projected visual image to be reflected, and the projected visual image to surround a viewer within the first interior space in 360°.

The projector component may be programmed or configured to project different images to a plurality of interior spaces separated by interior mirrored walls, so that the projected images on the projections surfaces of each interior space are reflected to surround the viewer.

In a preferred embodiment the exterior wall is about 9 feet tall or greater, or about 10 feet tall or greater. The exterior wall may comprise at least one door per interior space, and preferably comprises at least two doors, to permit people to gain entry into the interior of the enclosure. By "door" is meant to include a door having hinges or any other substantially opaque closure having a projection surface on its interior surface. When closed the door(s) may preferably be substantially flush with the surrounding interior projection surface of the wall in order to maintain a relatively smooth, continuous projection surface without substantial distortion of the image when the door(s) is/are closed.

The projector component may be mounted above the exterior and interior walls. For example, in a preferred embodiment (as described above: in which the enclosure is circular in its plan view shape and a single interior mirrored wall has a mirrored reflecting surface on both interior surfaces of the wall and bisects the circle creating two equally sized interior spaces) the projector may be mounted on, and be raised to a desired height directly above, the mirrored wall.

It will be understood that in other embodiments the enclosure may be oval, Cassini oval, elliptical, or "pill" shaped in plan view. In such cases, the two-sided mirrored interior wall is preferably placed, for example, at the midpoint between the curved lobes of the plan view, thereby creating two interior spaces of equal or approximately area and equal or approximately equal shape (or equal or approximately equal chiral shapes) with the projector component mounted above the mirrored internal wall. In such cases the projection surfaces of the walls will not be equidistant from the projector component, and the projector may need to be adjusted in order to account for the different distances of the projected image on closer and more distant projection surfaces. Standard formulae for making such adjustments include:

$$W = \left(\frac{(I-f)}{f}\right)w$$

$$I = \left(\frac{W}{w} + 1\right)f$$

$$f = I \div \left(\frac{W}{w} + 1\right)$$

in each case, where w is the projection aperture width; I is the projection distance from projector lens surface to screen; W is the image width; and f is the focal length of the lens.

If the projection surfaces of the walls are not equidistant from the projector component, and if the projector component is a projector array comprising individual image projectors, each projector may be individually focused and its projected image aligned with the other projected images of the other projectors in the array when it is installed.

In some embodiments the enclosures of the present invention may comprise a curved interior projection surface, for example as the interior surface of an exterior wall, and a mirrored exterior wall along the "baseline" connecting the two ends of the external wall having an interior projection surface. Thus, for example, in one embodiment the enclosure comprises a substantially opaque, substantially continuous exterior wall having at least one interior surface comprising a projection surface forming the arc of the semicircle. A mirrored exterior wall forms the baseline of the semicircle, wherein at least the internal surface of the mirrored exterior wall is mirrored. The two exterior walls thus form a semicircular interior space. In such a embodiment, the projector component may be structured to project one or more visual image around the 180° semicircular projecting surface of the semicircular interior space. The projector component may be placed at a location above the midpoint of the mirrored exterior wall; in this embodiment such placement ensures that the projector component is approximately equidistant from the projection surface of the curved exterior wall.

In other similar embodiments the enclosure may comprise a curved interior projection surface, for example as the interior surface of an exterior wall, and a mirrored exterior wall along the "baseline" connecting the two ends of the external wall having an interior projection surface, defining an interior space in the shape of, for example, a half oval, a half Cassini oval, a half ellipse or a half "pill shaped" floor plan.

In enclosures having this type of plan view both the curved walls and mirrored walls are external. It will be understood that in such "half sized" enclosures (including semi circular enclosures) internal mirrored walls may also be employed. For example, a single straight double sided mirrored wall may be placed at right angles to the mirrored exterior wall, thus dividing the single internal space into two chiral interior spaces of equal or approximately equal area. As with the "full sized" enclosures described above, the exterior wall may comprise at least one door per interior space to permit separate ingress to the internal space by clients and practitioners.

The enclosures may be built as permanent structures, or as semi-permanent or temporary, easily disassembled structures. Particularly when placed inside office space or other leased space, it may be desirable that the enclosures may be easily disassembled. Furthermore, for use at temporary events, such as outdoor festivals, fairs, or other such events, a temporary enclosure may be desired.

Thus, depending on the desired use of an enclosure of the present invention, and the anticipated length of such use, the walls of the enclosure may be made of any suitable material consistent with such use. The walls may be rigid and made using one or more materials comprising, without limitation, wood, plaster, brick, masonry, sheetrock, polymeric materials, composite materials or other conventional building materials. For example, the walls may be framed using wood and/or metal framing, then covered with lathe and plaster, sheetrock or another surfacing material.

Alternatively, and preferably, for more lightweight and less permanent enclosures, the enclosures made be constructed using a framework, such as a polymeric or metal framework. Currently preferred frameworks are made using metal tubes, such as aluminum tubes and/or metallic, such as aluminum, flat bars. In embodiments in which the enclosure is contained within a room or other indoor space, the framework and/or the projector component may be wholly or partially mounted to the floor and/or ceiling of the indoor space. The exterior walls of the enclosure may be made using a lightweight but preferably rigid and opaque material, such as a polymeric material. A preferred polymeric material for wall construction is a flexible polycarbonate/rubber blend, which may be provided as one or more flexible panels and may be made opaque or translucent.

In some embodiments of the invention, an enclosure may be constructed to be wholly or partially portable. For example, the enclosure may be mounted to a planar floor or platform having a plurality of wheels mounted to the underside thereof. Such a portable enclosure may be transportable either as payload on a truck (such as a flatbed truck) or may be made "towable" with a trailer-type hitch to be fastened to a car or truck for towing to a desired location, such as a festival, music or wellness-related event, farmer's market, fair or other such activity for use over a particular length of time.

Preferably the projector component comprises an array of projectors, arranged in a circular, oval, Cassini oval, elliptical, or "pill shaped", semi-circular, semi-oval, semi-elliptical, or semi-"pill shaped" shape. In some cases the outline of the projector component follows the pan view shape of the enclosure itself. Each projector may be arranged to project a portion of an entire image, whereby, for example, projectors on each side of a designated first projector may project visual images that continue to the right and left sides, respectively, of the image projected by the first projector. The entire image may encompass an angle of 360°, 180° or any other desired horizontal breadth, and be made up of a plurality of individual projectors.

The projector component may preferably be connected to an image source. The image source may reside on a memory storage device, such as, without limitation, a flash drive (memory stick), camera (such as a digital camera output), video source, DVD, hard drive or the like. Preferably the projector component is connected to a microprocessor, for example, as part of a network, by a directed wired connection, or by a wireless connection, on a digital device. The digital device may comprise a server, desktop computer, laptop computer, tablet computing device, smartphone, media player or any other device containing a microprocessor and able to transmit digital images to the projector component.

Alternatively, the projector component may itself be structured to store image files and/or display visual images without the need to be connected to a further image storage device.

Preferably the projector component is mounted at a level above the enclosure wall height on a ceiling of the enclosure of the present invention, on a ceiling of the room or space in which the enclosure is placed, or on a framework element of the enclosure of mounted on a wall of the enclosure. The projector component may also or alternatively be suspended from the ceiling or a framework element by one or more cable.

In a particularly preferred embodiment, the projector component may, in a plan view, comprise a curved or circular housing located in a central location above the enclosure, in which individual projectors are radially mounted as a projector array. When the enclosure is semi-circular, semi-Cassini oval, semi-oval, semi-elliptical, or semi-"pill shaped" in plan view the projector component is preferably positioned at a location approximately along an axis running perpendicular to and midway along the mirrored exterior wall, and at a level above this wall.

Such a housing generally may be shaped in plan view like a circular, Cassini oval, oval, elliptical or pill-shaped "flying saucer" or "UFO".

BRIEF DESCRIPTION OF THE DRAWINGS

FIG. 3A shows a view of the top cap of the oval enclosure of FIG. 1.

FIG. 3B shows a cross section of a manner in which the exterior wall of the enclosure of FIG. 2 may be sandwiched between curved sheets of retaining material.

FIG. 3C shows a cross section of the exterior wall retained as shown in FIG. 3B between curved sheets of retaining material, in which a top cap is placed.

FIG. 3D shows a cross section of the exterior wall retained as shown in FIG. 3B between curved sheets of retaining material, in which a bottom cap is placed.

FIG. 12 B is a rendering of an interior space in which a nature subject is projected on the projection surface of the curved interior walls thereof, and a mirror reflects the projected nature subject.

DETAILED DESCRIPTION OF THE INVENTION

Figure 1:
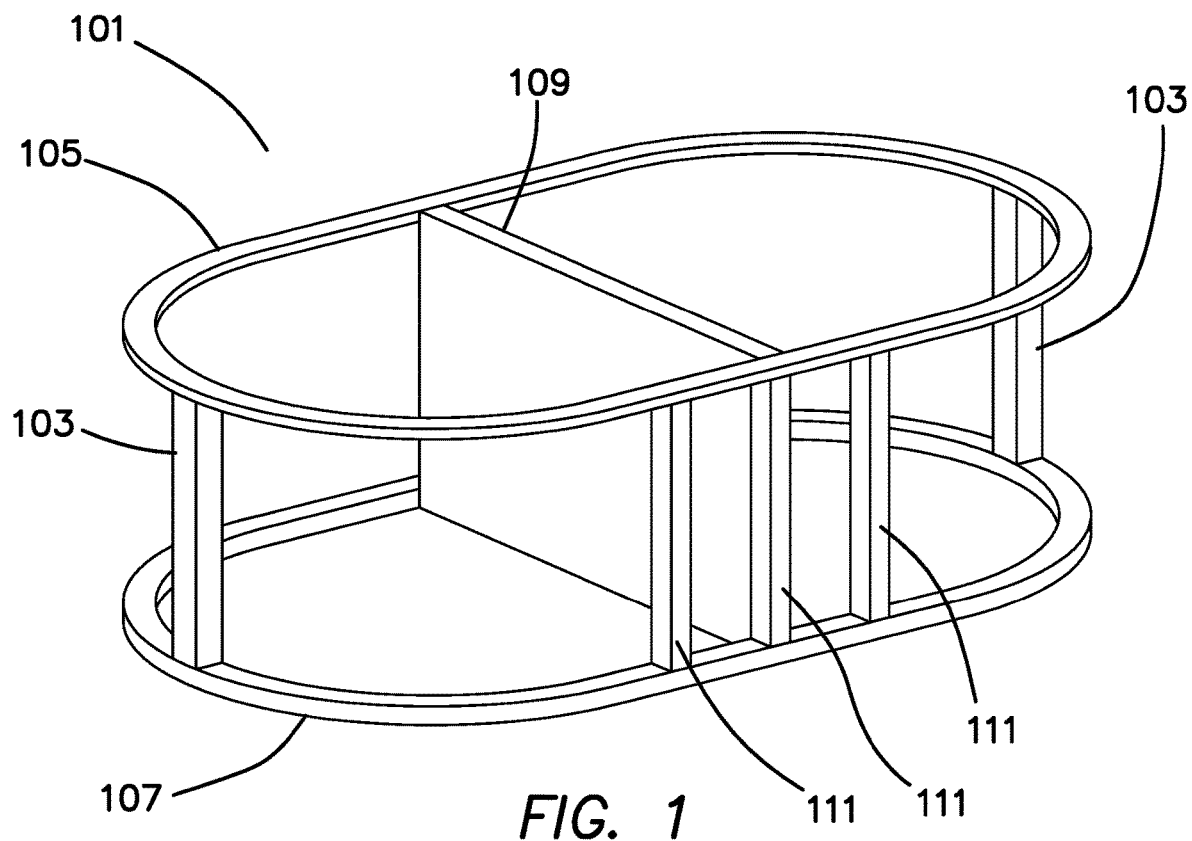
FIG. 1 shows a view of an embodiment of a frame component for an oval enclosure of the present invention.

The present invention is generally directed to wellness studios, rooms and enclosures, and methods of physically organizing a wellness center or studio and conducting the business of a wellness center or studio. In preferred embodiments, the invention is directed to wellness studios, rooms and enclosures comprising a mirrored interior wall.

In particularly preferred embodiments, the studio, room and enclosure comprises a projector component which projects images against a projection surface on the interior surface of one or more wall of an interior space of the enclosure in a manner that causes the projected images to be reflected back to an observer within the interior space. Very preferably the wall upon which the projection surface is located is curved. In particularly preferred embodiments, the enclosure is circular, oval, Cassini oval, elliptical, or "pill shaped" floor plans, or semi-circular, semi-oval, semi-elliptical, semi-Cassini oval or semi-"pill shaped", with at least one interior space having a substantially continuous wall comprising a curved projection surface for the projection of visual images such as films, photographs, graphics, video and the like from the projection component. In this way, the reflection of the projected visual images have the same apparent curvature as the walls upon which the images are projected. For example, if the interior space is semicircular, then the mirrored interior wall would result in the illusion that the interior space was circular in shape, and images projected on the wall, particularly when the interior space is otherwise darkened, would provide an illusion of surrounding the observer.

It will immediately be apparent to the person of ordinary skill based upon this example that the enclosures, rooms and studios of the present invention may be constructed in numerous variations. For example, the enclosure may be made to have, without limitation, a semi-circular, semi-oval, semi-elliptical, or semi-"pill shaped" floor plan view. Such "half-sized" enclosures may also have a straight mirrored wall as a baseline (e.g., as a diameter of the full circle), to create the illusion of a fully circular interior space to an observer located therein. In these cases, the mirrored wall may comprise an exterior wall of the enclosure, and one or more additional exterior walls (e.g., having may comprise the curved portion of the plan view of the enclosure.

In less preferred embodiments the enclosures may comprise a mirrored interior wall and non-curved projections surfaces on one or more exterior walls. Thus, although enclosures according to the present invention having curved geometric plan views are preferred, in currently less preferred embodiments the floor plan of an enclosure according to the present invention may comprise polygonal geometric elements, such as rectangular elements, triangular elements, pentagonal elements, hexagonal elements, heptagonal elements, octagonal elements, and the like.

Not only may the curvature of the projection surfaces of the enclosure vary from the circular or semicircular to include other curved symmetrical and asymmetrical shapes such as (such as oval, Cassini oval, elliptical, or "pill" shapes or portions of these shapes (such as semi circular, semi-oval, semi-elliptical, or semi-"pill" shapes"), but the enclosures may be multi-lobed structures as well.

Additionally, in certain embodiments the shape of the enclosures may be "tunnel" shaped (such as an elongated arch structure similar to the shape of a Quonset hut), with a double-sided mirror dividing the sides of the "tunnel into equal halves". The tunnel may be closed at one or both ends, either of which also may comprise a door. In such an embodiment the projectors are placed so as to project against the sides of the tunnel structure, with the mirror reflecting the projected images. The tunnel structure may be made from any suitable material, including, without limitation, metal (such as contour track metal), polymer or wood may be used for the arch framing, and the covering also made using any suitable material, such as (without limitation) polycarbonate, dry wall, plywood, metal (such as a corrugated metal sheet) and/or stretched fabric or sheets of material.

In other embodiments the exterior outline of the enclosures may be dome-shaped, half-dome shaped, hemispherical, or semi-hemispherical. In the embodiments in which the enclosure is hemispherical, an interior wall comprising a double-sided mirror (or two single sided mirrors) may be located so as to divide the interior space of the dome into two equal interior spaces. The interior wall comprising the mirror may appear in plan view as a line connecting diametrically opposed points on the circumference of the circle and defining the footprint of the dome. In other embodiments, two or more mirrored interior walls may intersect at the center of the dome footprint, thus dividing the interior space into three or more interior spaces shaped like halved sections of an orange. For example, two doubly mirrored interior walls, when observed in plan view, may meet at 90° at the center of the circle circumscribed by the walls of the dome, thus dividing the interior of the dome into four equal internal spaces or volumes, wherein two of the walls of each such interior space are mirrored, and the curved exterior wall comprises an interior projection surface. However, the angle between interior mirrored walls need not be 90° and the sizes of each interior volume or space need not be equal.

Each internal space of this embodiment may be entered through a door, which may be formed, for example, in the external wall of the dome. In this embodiment, the projectors are placed overhead (for example, near the center of the dome) so as to project visual images against the internal surface of the exterior walls of the dome segment(s) or internal space(s), with the mirror(s) reflecting the projected images so as to form the illusion that each space is larger than it is. The dome structure may be made from any suitable material, including, without limitation, metal (such as contour track metal), polymer or wood may be used for the arch framing, and the covering also made using any suitable material, such as (without limitation) polycarbonate, dry wall, plywood, metal (such as a corrugated metal sheet) and/or stretched fabric or sheets of material.

In yet another embodiment of the invention the enclosure can be formed within a room, for example, a hospital room by locating fasteners (such as tracks, hooks, snaps, and the like) on or along the floor and ceiling thereof, and stretching a curtain, screen or fabric comprising a projection surface between the floor and ceiling, preferably in a curved alignment. Projectors may be located or suspended from the ceiling or mounted on a portable holder that may be positioned to project images against the projection surface. A mirror or mirrored film or fabric may also be stretched or erected substantially perpendicularly to the floor and ceiling to reflect the images projected on the projection surface. Such embodiments may be useful for creating temporary enclosures of the present invention at locations including schools, hospitals and workplaces.

Furthermore, as another example, an enclosure of the present invention may have a floor plan comprising an architectural foil (a symmetrical rendering comprising a floor plan containing of arcs of otherwise overlapping circles that produce a series of cusps to make a lobe) in plan view such as trefoil (3 cusps), quatrefoil (4 cusps), cinquefoil (5 cusps) or any other number of cusps. See e.g., Trefoil, Wikipedia (https://en.wikipedia.org/wiki/Trefoil); see also Foil (architecture), Wikipedia (https://en.wikipedia.org/wiki/Foil_(architecture); each hereby incorporated by reference. Such multifoils may comprise an inner polygonal chamber in the center formed from the intersection of straight mirrored walls which reflect visual images projected onto a projection surface of each cusp of the foil.

The enclosure may be permanent, semi-permanent, or temporary. A permanent enclosure is constructed in a manner similar to that of any other structure, having a floor and walls, and may be made using framing materials such as metal (e.g., aluminum or steel) components, reinforcements such as metal rebar, and/or wood. The walls may be made using, wood, plaster, brick, masonry, sheetrock, polymeric materials, composite materials or other conventional building materials. A free standing enclosure of the present invention preferably has a roof, which can be, for example, flat, pyramidal, done-shaped, tented, or rounded. In such case the roof can be made of any conventional building or roofing materials, canvas, a polymeric material, such as an opaque polycarbonate.

Semi-permanent or temporary version of the enclosure can be used in two common circumstances. A semi-permanent enclosure may be constructed within a space located in an already-constructed building. Thus, in certain embodiments a wellness center may be located in a conventional commercial space or office building, with an enclosure according to the invention installed within the commercial space, or within a room of the commercial space, and a "store", waiting area, and/or consulting rooms located in one or more other area of the commercial space. In such cases, often (but not invariably) the enclosure will not comprise a roof, and will be constructed in a manner that is relatively easily installed and disassembled, as with most "build-outs" within commercial leased space. In some embodiments a free-standing frame may be constructed using vertically extending support members, such as wooden, metallic and/or polymeric beams to support upper and lower curved wooden, metallic and/or polymeric flat arcs (which may be provided in a number of segments). Preferably the support members and top and bottom arcs are made of aluminum, for light weight and strength. The projection screen and/or wall material is preferably made from a lightweight opaque or non-transparent polymer, and is preferably flexible. This can be secured to the frame by any suitable method; for example, the projection surface may be sandwiched between the top and bottom metallic and/or polymeric arcs. The sandwiched wall material may also be retained in place by any suitable methods, such as by using bolts through holes in the projection screen and/or wall material, or by a clamp incorporated into top and/or bottom metallic caps and tracks.

In another embodiment the enclosure may be supported in an alternate arrangement without support members. In this embodiment the top and bottom curved metallic and/or polymeric arcs are inserted into loops formed at the top and the bottom of a flexible projection screen and/or wall material, like a curtain rod. The walls are preferably made from a lightweight opaque or non-transparent polymer. A plurality of cables, wire or lines are connected at one end to the top metallic and/or polymeric arcs through holes in the loops of the top edge of the projection screen and/or wall material. The cables are then connected at their other end to the ceiling or other structure above the enclosure.

In preferred embodiments, at least one straight, doubly mirrored internal wall is positioned and secured on either side of the enclosure, to define at least two internal spaces within the enclosure. In other embodiments a singly mirrored wall may be used to define at least one internal space. The mirrored wall(s) may, in less preferred embodiments also be comprised of a flexible material such as that of the exterior walls.

In enclosures in which a doubly mirrored wall transects the enclosure defining two or more internal spaces, it is particularly important that the doubly mirrored wall(s) are opaque and will not permit light to bleed from one internal space to another. Additionally, it is desirable that the mirrored surfaces of the mirrored interior wall(s) reflect the projected visual images from the projection surfaces on the walls of an interior space without significant distortion. Thus, in a preferred embodiment the mirrored interior wall(s) may be made from a rigid, preferably lightweight material, such as a polymeric foam to which mirrored full length sections are secured on each side. The wall material may be joined at the top (or top and bottom) to the opposing sides of the top and bottom curved metallic and/or polymeric arcs; for example by bolting.

The walls of the enclosure are typically from about 9 feet to about 10 feet high. In one embodiment of a "pill" shaped enclosure, the interior doubly mirrored wall is 30 feet in length, and is placed midway between (e.g., 20 feet from) each of the two curved ends of the exterior wall.

One or more doors may be designed into the enclosure by including metallic and/or polymeric supports with hinges, to which the preassembled doors may be hung. Preferably, the interior surface of the door comprises a projections surface. Additionally, preferably the doors are designed to be substantially flush with the remainder on the projection surface in order to minimize distortion of the projected images.

In another preferred embodiment an enclosure of the present invention may comprise a generally circular, oval, Cassini oval, elliptical, or "pill" shape in plan view, in which a passageway bisects the interior space of the enclosure into two separate, preferably equally sized interior spaces. In this embodiment the passageway comprises a wall on either side thereof; each wall has an exterior surface facing the passageway, and an interior surface facing one of the interior spaces. In some cases one or both walls may have a door defined within. In other embodiments, the exterior wall of the enclosure may have a door opening defined for each interior space. The interior surface of each passageway wall is preferably mirrored. Such configurations are depicted in e.g., FIGS. 9 and 10.

In some embodiments the exterior wall may consist of a projection material; such as a polyvinyl chloride (PVC) front projection screen, a PVC 3-D silver projection screen or a Lycra®/cotton blend stretch fabric. In other embodiments the exterior walls of the enclosure may comprise a polyvinyl chloride (PVC) front projection screen material, a PVC 3-D silver projection screen material or a Lycra®/cotton blend stretch fabric, for example as a lining secured on the interior surface of a flexible polycarbonate sheet.

In a currently particularly preferred embodiment, the projector component may, in a plan view, comprise a curved or circular housing located in a central location and suspended or located at a height above the walls of the enclosure, in which individual projectors are radially mounted as a projector array and wirelessly or hard wired to a network remote production computer controlling the overall image projection among the projector array. When the enclosure is semi-circular, semi-Cassini oval, semi-oval, semi-elliptical, or semi-"pill shaped" in plan view the projector component is preferably positioned at a location approximately along an axis running perpendicular to and midway along the mirrored exterior wall, and suspended or located at a level above this wall.

Such a housing generally may be shaped in plan view like a circular, Cassini oval, oval, elliptical or pill-shaped "flying saucer" or "UFO". In one embodiment for a circular enclosure having a diameter of 40 feet, the area of the enclosure is about 1,250 feet, and the circumference of the enclosure is about 125.7 feet. The exterior walls of the enclosure are 10 feet high. The desired image is approximately 9' 10" high, and 17' wide. Thus, with some overlap between edges, 8 projectors would be required to project an image around the circumference of the enclosure. Using a 0.8 lens, each projector in the projector array may be about 13'6" from the center of the circle in order to throw a projected image that will fill the projections surface at an acceptable brightness.

In other embodiments, individual projectors may be mounted on or suspended from the ceiling proximate the inside circumference or perimeter of the projection surface, and wirelessly or hard wired to network remote production computer controlling the overall image projection among the projector array. Such projectors may be "ultra short throw" projectors (which must be mounted relatively close (e.g., about 60 cm) to the projection surface, "short throw" projectors which may be mounted about 90 cm to about 100 cm or so from the projection surface, or longer throw projectors, which may be mounted 2 m or more from the projection surface.

Preferably the projectors each have a brightness capacity of about 4000 lumens or more, or about 5000 lumens or more, or about 5500 lumens or more, or abut 6000 lumens.

In some embodiments the projectors in a projector array may be assigned to project 2 or more different images simultaneously. Thus, for example in a circular enclosure having an doubly mirrored interior wall equally dividing the enclosure into two interior spaces, the projectors illuminating the projection surfaces of one interior space may be coordinated to project one visual image, and the projectors illuminating the projection surfaces of the other interior space may be coordinated to project a different visual image. In some embodiments a single projector array may be configured to project 3 or more or 4 or more images, or 5 or more images simultaneously. Furthermore, in certain embodiments, particularly (but not exclusively) those involving multifoil enclosure floor plans and/or larger enclosures, the enclosures of the present invention may comprise more than one projector array.

In some embodiments the enclosure may be portable, to be used at festivals, outdoor events, conventions, fairs, promotional events, and the like. For such uses, including outdoor uses, the enclosure may in certain cases comprise a roof to enhance sensory isolation from the outside world and lessen the possibility of distraction. Such enclosures may be constructed modularly in a manner similar to a semi-permanent enclosure, with a frame comprising support beams, pre-fabricated doors and door frames and/or a cable system, thus permitting the enclosure to be erected and disassembled quickly and easily. Alternatively, the enclosure may be constructed as a permanent structure with wheels, such as a trailerable enclosure, which may be transported from location to location.

In some embodiments the enclosures of the present invention are also equipped with humidifiers, heaters, scent generating means (such as, without limitation, incense burners and essential oil dispersers), such as flavored or unflavored mist generators, fans to generate a breeze, audio equipment comprising one or more speakers to generate sounds, such as natural sounds such as waterfalls, rain, thunder, jungle sounds, beach sounds, bird calls, the ringing of devotional bells, musical sounds such as flutes, Indian music, relaxing guitar, zither and classical sounds, and the like.

The Examples that follow provide further disclosure concerning the invention; however the invention is not limited by the examples, and is defined by the claims that conclude this specification.

Examples

FIG. 1, depicts a free-standing frame 101 for one embodiment of the enclosure of the invention. In this embodiment, a circular enclosure is shown; those of ordinary skill in the art will recognize that a frame structure as depicted in FIG. 1 can be altered to define an elliptical shape, an oval shape, a pill shape, a Cassini oval shape or any other desired shape, preferably having continuously curved opposing ends and/or sides.

The free-standing frame comprises support vertically extending support members 103, and top and bottom metallic arcs (105 and 107, respectively). Preferably the arcs are made of aluminum tubing or aluminum flat bars, but may be made of carbon fiber, steel, a strong rigid polymer or the like. Similar materials make up the door frame assembly of the frame 111, which also acts as a vertically extending support element. As shown, the vertically extending support members 103 and door frame assembly 111 supports are positioned approximately 90° from each other around the circumference of the frame.

Those of skill in the art are aware that a greater or lesser number of support members/assemblies 103, 111 may be used, and spaced approximately equally around the circumference of the enclosure frame to maximize stability of the frame. These elements are secured to the top and bottom arcs 105, 107, by any effective means, for example using bolts. Additionally, the top and bottom arcs themselves may comprise segments which are assembled at the site of installation, again by securing together, such as by bolting or insertion of a male end of one arc segment into the female end of an adjoining arc segment.

Similarly, a preassembled mirrored interior wall 109 is shown in FIG. 1 as installed as part of the frame; this wall provides transverse stability to the enclosure, and is secured by any effective means. Preferably the wall is into place on the top and bottom metallic arcs. In other embodiments, the preassembled wall may be replaced with a top (or a top and bottom) transverse support component to which a mirrored wall may be subsequently secured as will be described, for example, with respect to FIG. 2.

Figure 2:
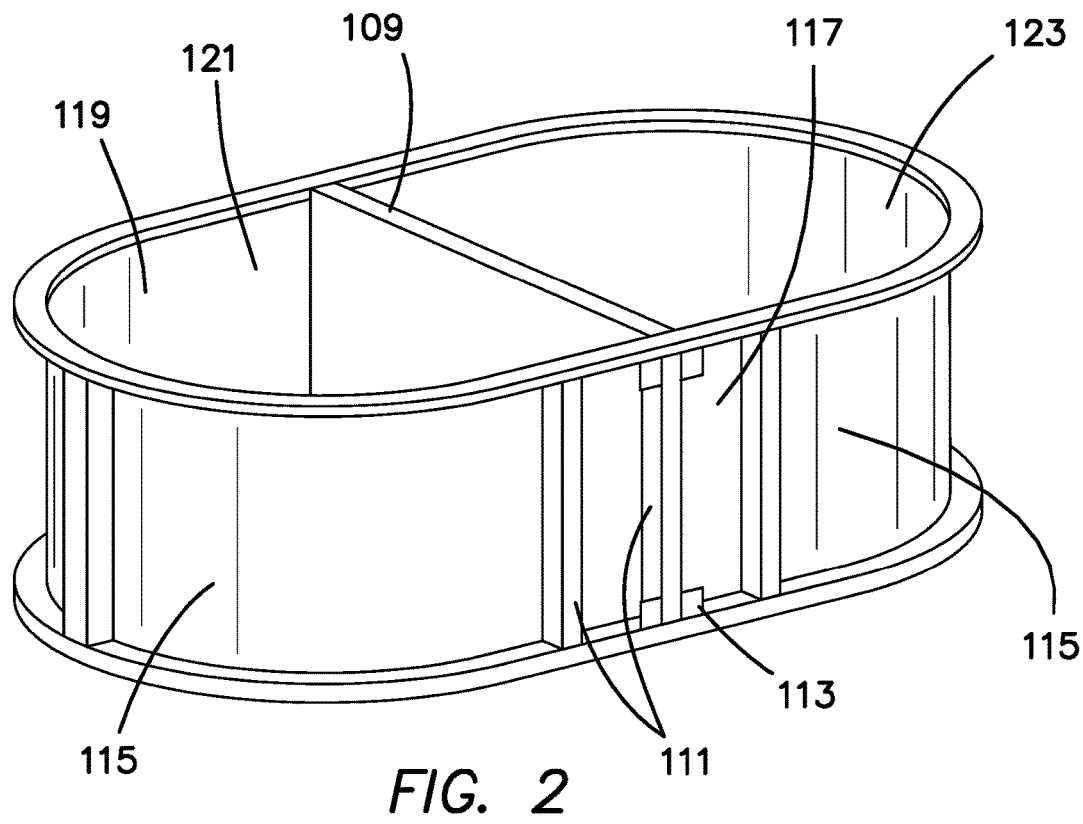
FIG. 2 shows a view of the enclosure shown in FIG. 1 in which the frame component is covered with an exterior wall and, and comprises one mirrored interior wall.

Turning now to FIG. 2, the enclosure is now shown with walls in place. Again the vertically extending support components 103 and door assembly 111 are shown. The exterior facing wall material 115 is shown, as is the interior projections surface of the walls 119. Preassembled doors 117 are connected to the door frame assembly 111 by hinges 113 which are screwed or bolted into prepared positions in the door frame assembly. As shown in FIG. 1 and FIG. 2, this enclosure has two doors, one for each of the two equally sized interior spaces 121 and 123 created by the mirrored interior wall 109.

FIG. 3A shows a close up of the top metallic arc 105 shown in FIG. 1 and FIG. 2.

FIG. 3B is a cutaway drawing depicting one manner in which the wall material may be secured at the top metallic arc by being sandwiched between two curved flat metallic bars 125 and 125'. In this case a bolt hole is drilled in each of the two metallic arcs 11, as well as in the wall material 115. Preferably the holt hole in the wall material (not shown) is reinforced to prevent wear and tear from repeated use. The wall material may be retained at the bottom of the frame assembly in the same manner.

FIG. 3C is a cutaway drawing depicting another way in which the wall material may be secured at the top metallic arc by being sandwiched between two top curved flat metallic bars 125 and 125'. In this case a cap component 129 having a curvature matching that of the curved flat metallic bars 125 and 125' has a slot 131 having a width greater than that of the two bars, such that the wall material 115 may be retained by friction within slot 131 when the cap component is placed over the combined thickness of the curved flat metallic bars with the wall material sandwiched between. The cap 129 may also comprise a screw hole 133 permitting a retaining screw to be tightened to secure the wall material to the frame.

Similarly, FIG. 3D shows a cutaway of the base of the wall, wherein two bottom curved flat metallic bars 137 and 137' sandwich wall material 115 and are then placed into a boot 135 comprising a slot 139. The slot is sized to accommodate the combined width of the wherein two bottom curved flat metallic bars 137 and 137' sandwich wall material 115. Preferably, boot 135 has a flat bottom. Although cap 129 and boot 135 are shown as different elements, those of ordinary skill will appreciate that for economy and simplicity, boot 139 may be used as both a cap and a boot in the same enclosure frame assembly.

Figure 4A:
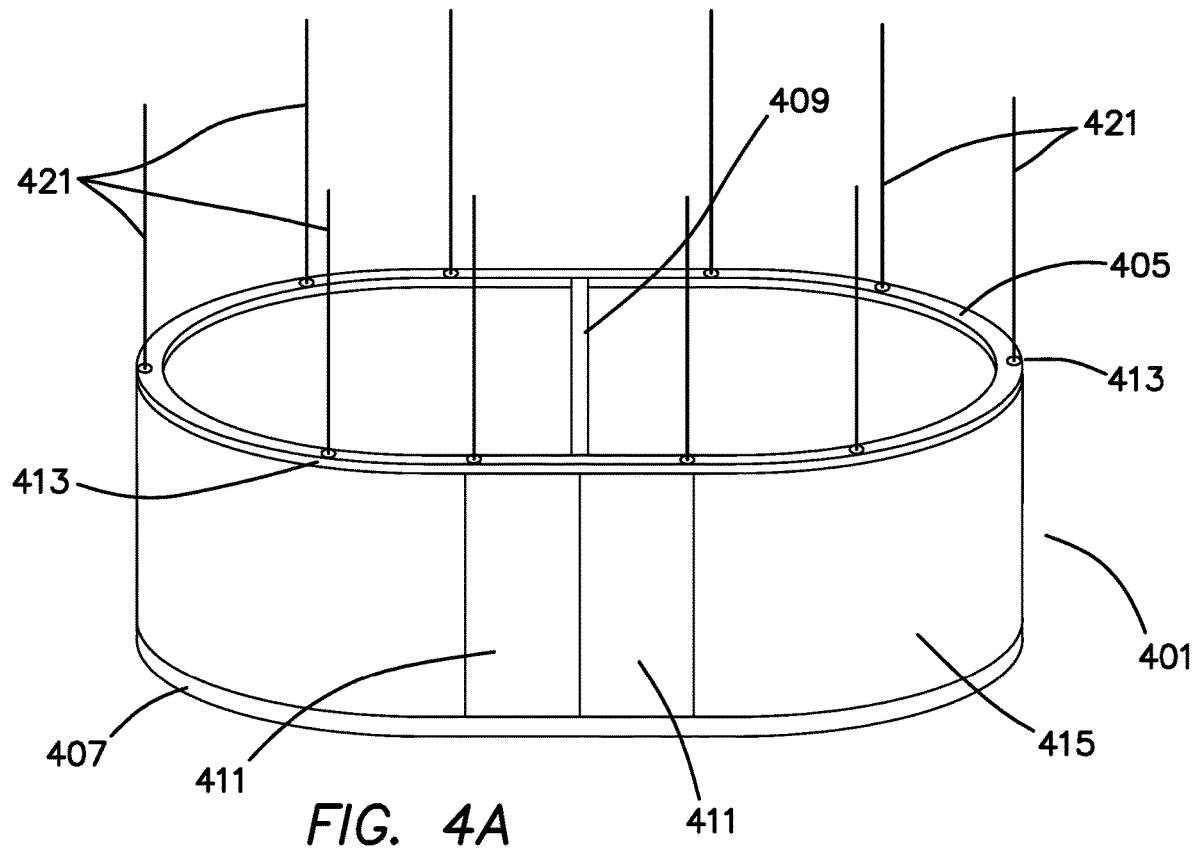
FIG. 4A shows a view of an embodiment of an oval enclosure of the present invention, in which the enclosure is suspended from above by cable or cord elements.

FIG. 4A shows an alternative view of a frame assembly 401, in which top 405 and bottom 407 curved arcs are not supported by vertically extending support components, as shown in e.g., FIG. 1. Rather, in this case the top metallic arc is suspended horizontally from the ceiling or an overhead frame (not shown) by a plurality of cables 421. As in FIG. 1, the top and bottom arcs themselves may comprise segments which are assembled at the site of installation, again by securing together, such as by bolting or insertion of a male end of one arc segment into the female end of an adjoining arc segment. Also as in FIG. 1, mirrored interior wall 409 is placed in position and secured to the top and bottom arcs.

In FIG. 4A the wall material 415 is shown already installed. The wall material 415 is made to form tubular loops or sleeves (see FIG. 4B) at its top and bottom through which the top and bottom metallic arcs may be inserted, like a curtain rod through the tubular sleeves. holes 413 are formed at substantially equidistant positions around the top of the top arc in the tubular sleeves of wall material to provide a way to secure the cables 421 to the top metallic arc. Each cable 421 may be secured to the arc by any suitable means. For example by using a turnbuckle and/or using a hook on the cable end and a hook in the top metallic arc, or ball in slot connectors and the like. Preferably the holes are reinforced to resist fraying or other damage to the wall material at the top of the top curved arc.

Figure 4B:
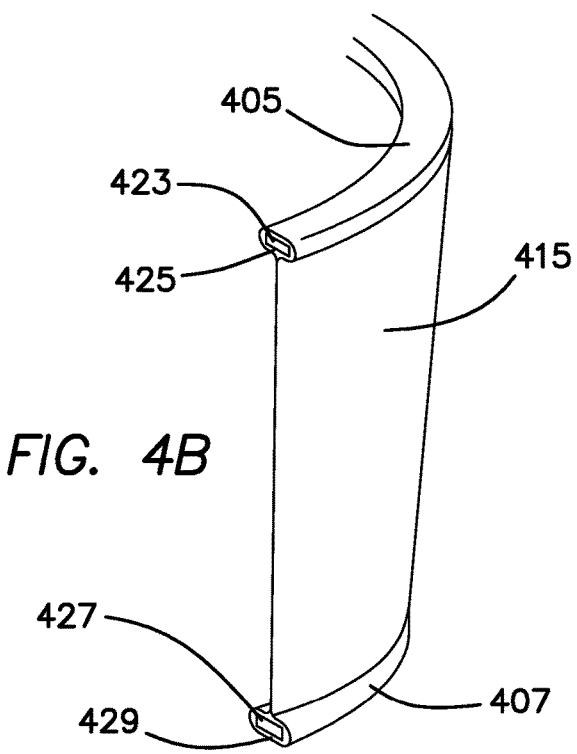
FIG. 4B shows a cross section of an exterior wall of the embodiment shown in FIG. 4A, in which the wall is looped around frame components inserted at both the top and the bottom of the wall material.

Turning now to FIG. 4B, a cross-section through the exterior wall of the enclosure shown in FIG. 4A reveals the top 423 and bottom 427 metallic arcs, and the corresponding top sleeve 425 and bottom sleeve 429, with the bulk of the wall material 415 falling between the top and bottom arcs (405 and 407, respectively).

Figure 5:
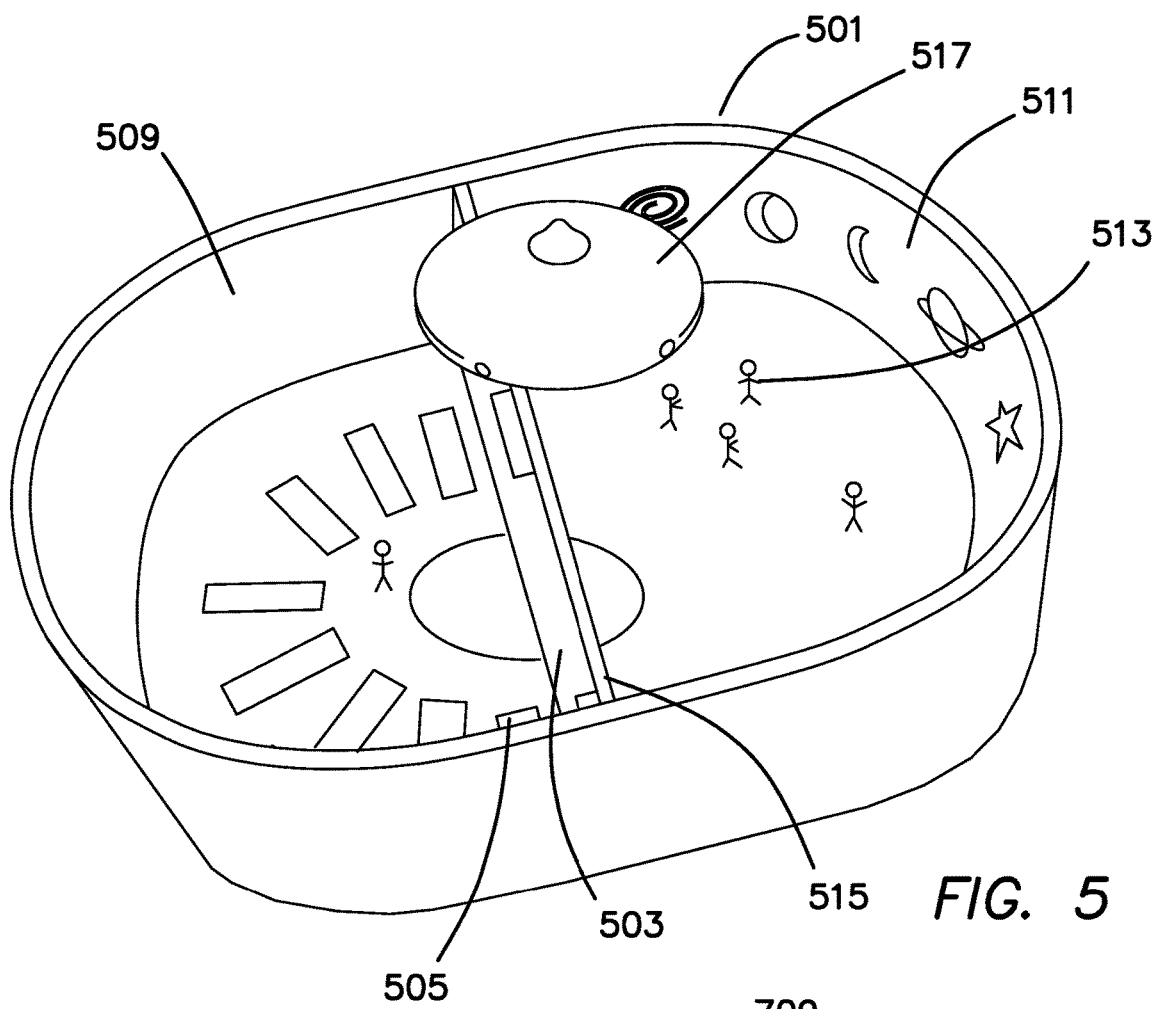
FIG. 5 is a perspective view of a pill-shaped enclosure having a single exterior wall and a mirrored interior wall, with a projector component located above, and midway along, the length of the interior wall.

FIG. 5 is a top perspective view of a pill-shaped enclosure 501 of the present invention, with a projector component "UFO" housing 503 and a single doubly mirrored wall 515 dividing the interior space into two equal halves; 505 and 513. In the left interior space 505 a yoga class is underway, with yoga mats and single instructor visible. The projection surface of this interior space is shown 509 with abstract designs being projected thereupon by the projector component. The mirrored surface 503 of the mirrored wall 515 is shown reflecting the image of the yoga instructor and mats from this perspective.

In the right interior space 513 another yoga class is underway with multiple students visible, without yoga mats being present. A different visual image, comprising astronomical images (galaxies, moons, planets and stars) is being projected from the projector component onto the projection surface 511 of the right interior space.

Figure 6:
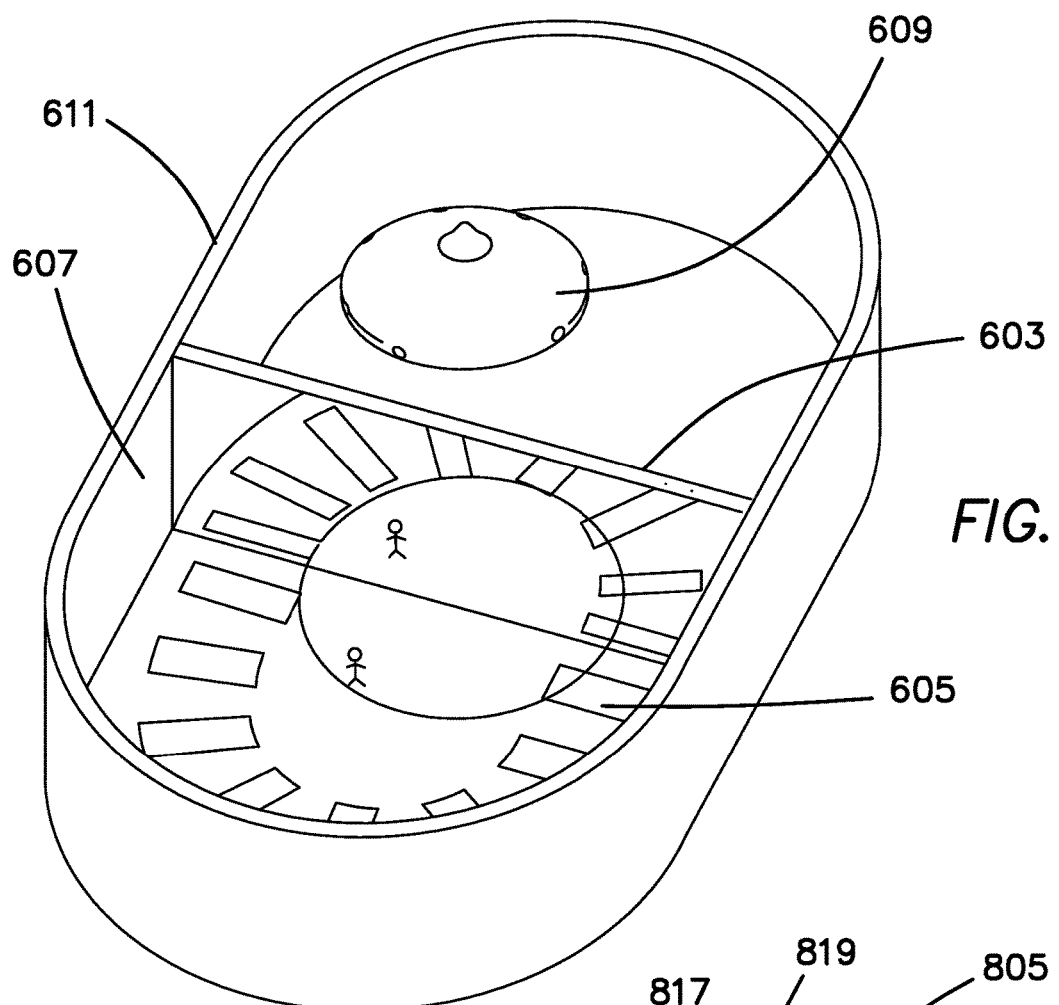
FIG. 6 is a perspective view of the pill-shaped enclosure shown in FIG. 5, in which the reflection of the interior of one of the two internal spaces is depicted.

FIG. 6 is a shallower view of the right interior space shown in FIG. 5 as reference numeral 505. In this view the mirrored wall 603 reflects the yoga instructor, mats, and interior projection surface 607 of exterior wall 611. The projector component 609 is shown suspended above the mirrored wall.

Figure 7:
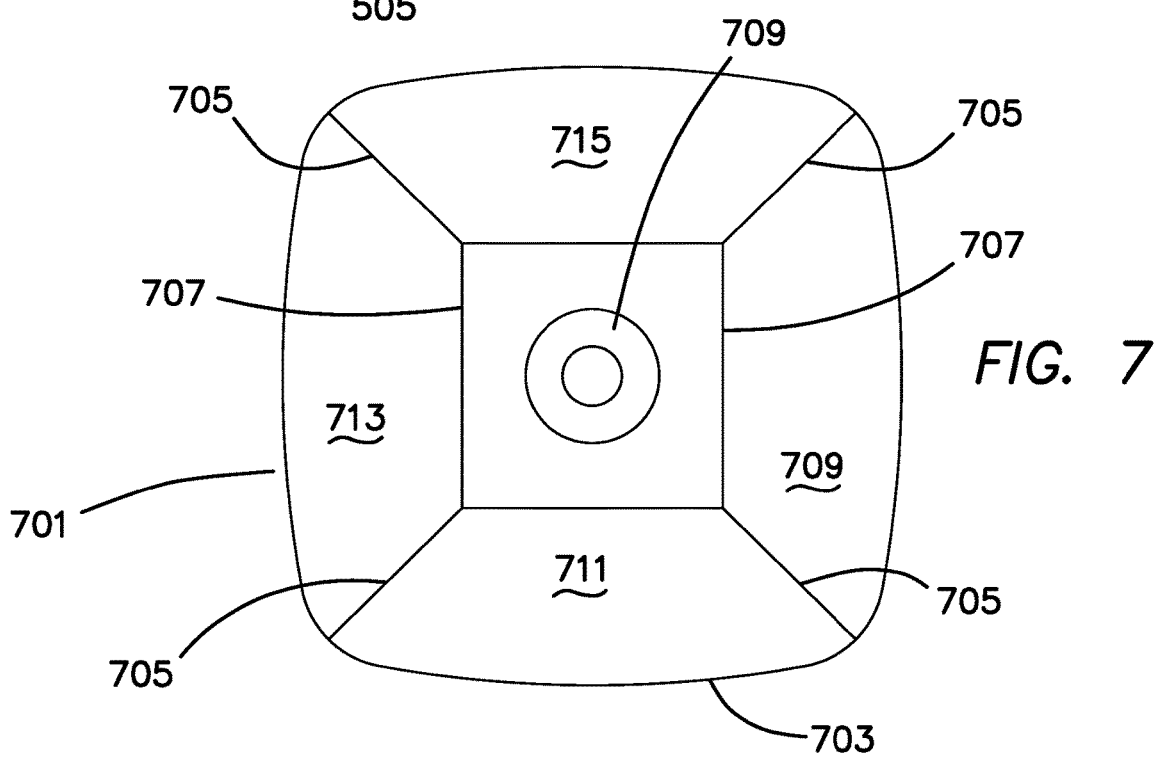
FIG. 7 shows a multichambered enclosure of the present invention, in plan view.

FIG. 7 is a depiction of a multichambered enclosure of the present invention, in plan view. Projector component 709 is configured to be capable to projecting visual images onto projection surfaces of 4 different interior spaces (709, 711, 713 and 715). Interior wall 707 is singly mirrored, while interior walls 705 are doubly mirrored. Exterior walls 703 have projection surfaces onto which visual images may be projected by the projection component 709.

Figure 8:
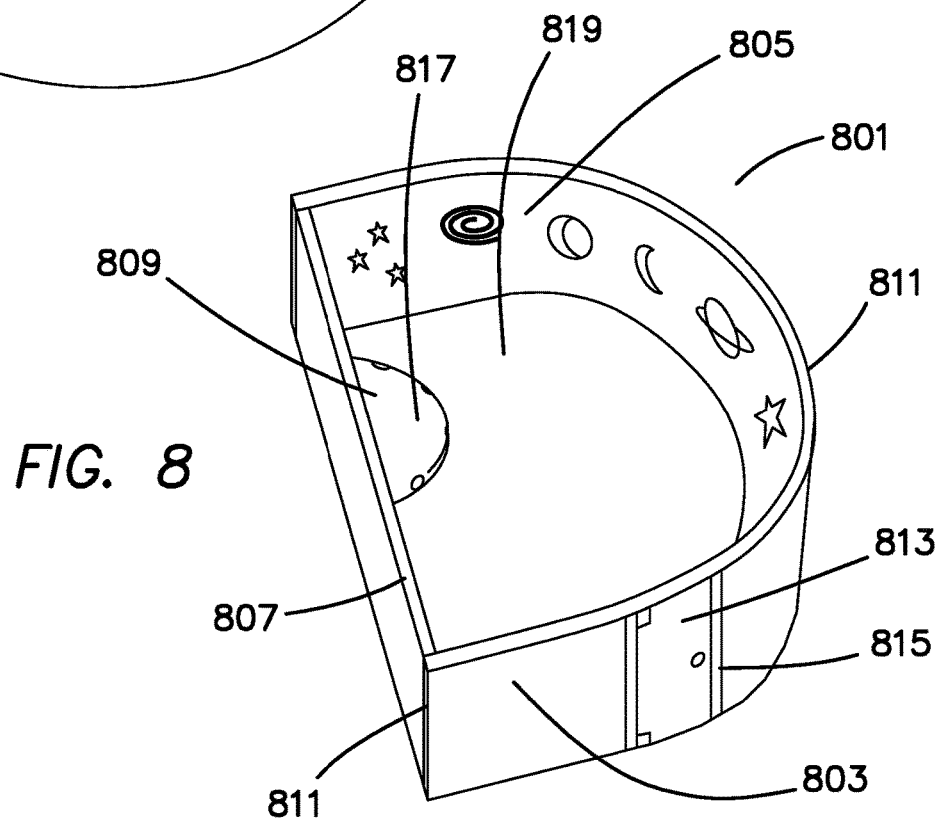
FIG. 8 shows a semi-"pill" shaped enclosure of the present invention, in oblique plan view.

FIG. 8 is a oblique view of a semi-"pill" shaped enclosure 801, in which exterior wall 803 is supported by frame supports 811 and door frame 805. Door 813 provides access to interior space 819. Exterior mirrored wall 807 may be formed as described in FIG. 2 and FIG. 3A-D, and joined to a mirrored surface of the interior surface of exterior wall 807. In another embodiment, the exterior mirrored wall may comprise a wall of an office or building space, such as a room with a polygonal floor plan, upon an interior surface of which a mirror or other reflective surface is applied; the term "exterior" wall is meant to apply to mirrored wall configurations as shown in FIG. 8 as well as in semi-circular, semi-oval, semi-elliptical, semi-Cassini oval, or semi-"pill shaped" floor plans.

Visual images are projected from a projector component 809 onto the interior projection surfaces 805 of the exterior wall 803. The projector component is suspended, preferably above the height of exterior wall 803, by cables joined to the ceiling. In other cases the projector components 809 may be mounted to the exterior wall 807 by cables 817.

Figure 9:
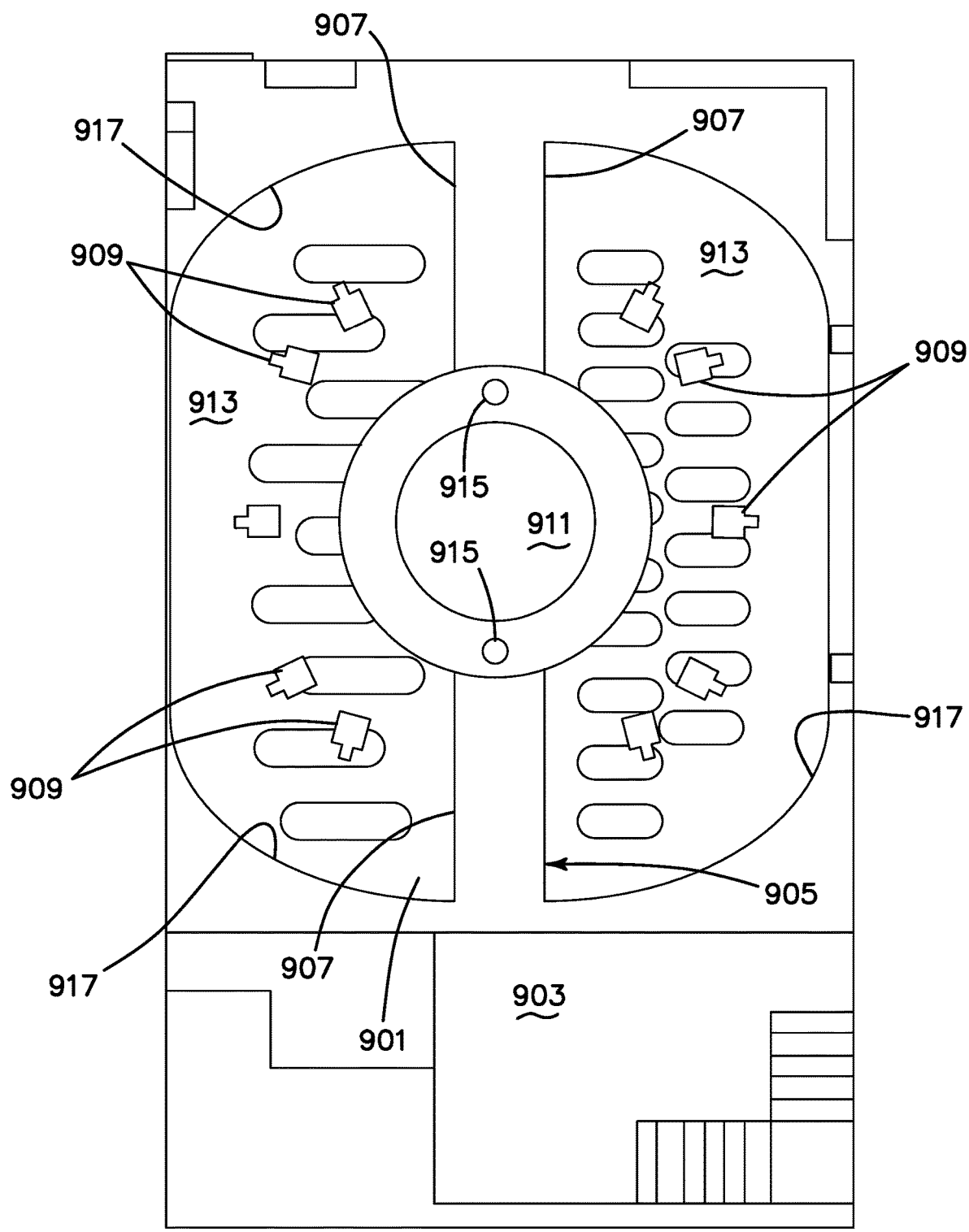
FIG. 9 shows another embodiment of the enclosure of the present invention in which a hallway bisects the "pill-shaped" enclosure.

FIG. 9 depicts a schematic representation of another embodiment of the enclosure of the present invention. In this case the pill-shaped enclosure 901 is contained within a rectangular space 903. A passageway or hallway 905 bisects the enclosure; hallway walls 907 define two chiral interior spaces 913. A central circular "UFO" structure 911 suspended from the ceiling contains lights 915 and projectors (not shown); additional projectors 909 are also suspended above head level, and face the interior projection surfaces 917 of each interior space 913.

Figure 10:
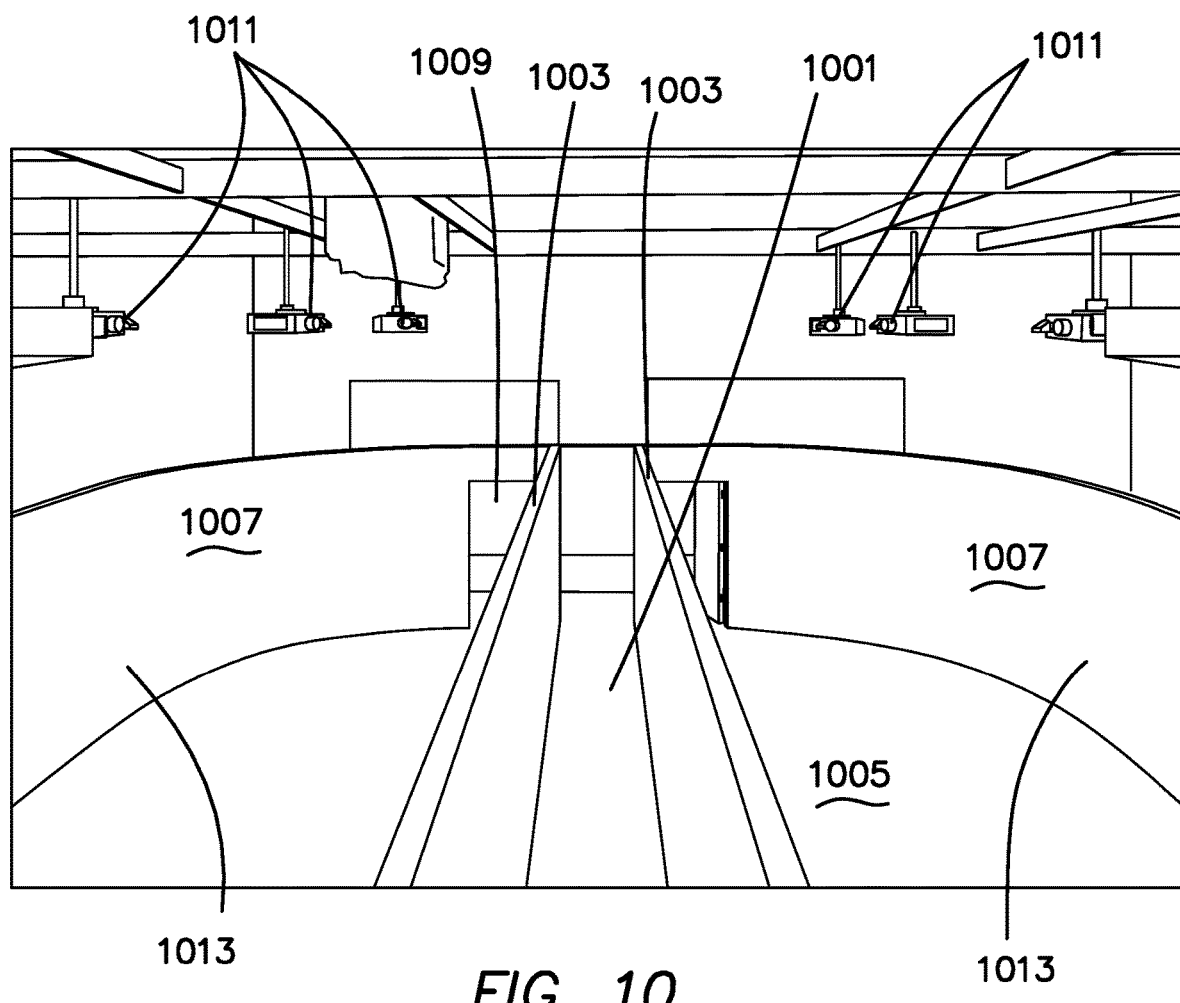
FIG. 10 shows a view along the hallway of an enclosure built within a rectangular space, similar to that of FIG. 9.

FIG. 10 shows an example of the embodiment of FIG. 9, wherein hallway 1001 comprises hallway walls 1003, defining two chiral interior spaces 1005. Doors 1009 are located in exterior walls 1007 which also have interior projection surfaces 1013. Interior sides (not shown) of hallway walls 1003 comprise a mirrored surface. Projectors 1011 are mounted from the ceiling.

Figure 11:
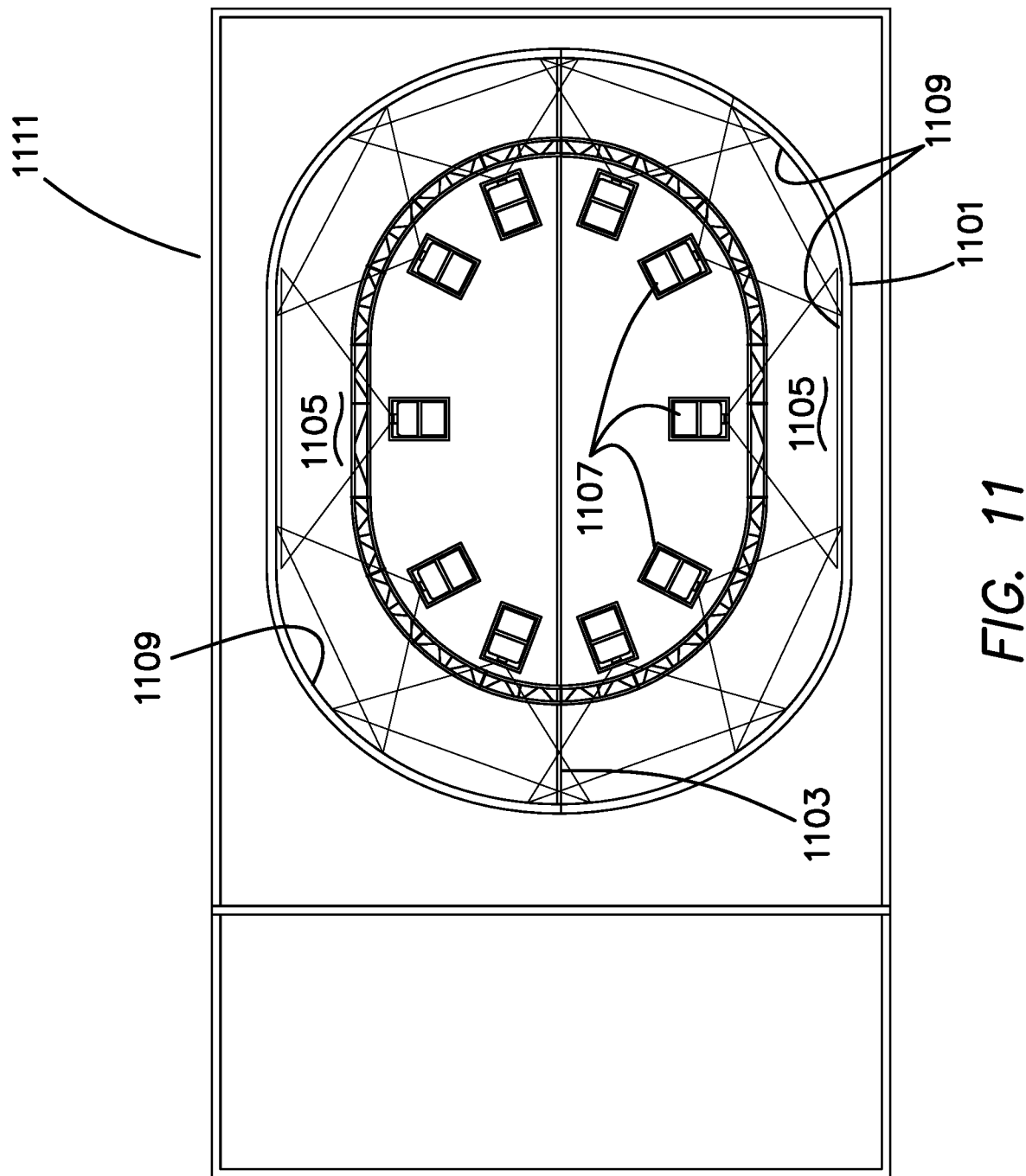
FIG. 11 shows another embodiment of the enclosure of the present invention in which a doubly mirrored internal wall bisects the enclosure into two equally-sized internal spaces.

FIG. 11 depicts another embodiment 1101 of the enclosure of the present invention, in which as doubly mirrored dividing wall 1103 defines chiral interior spaces 1105. Internal projection surfaces of exterior walls 1109 reflect projected images from overhead projectors 1107 mounted in a projector array. 1113. The entire enclosure is contained within a rectangular room 1111.

Figure 12A:
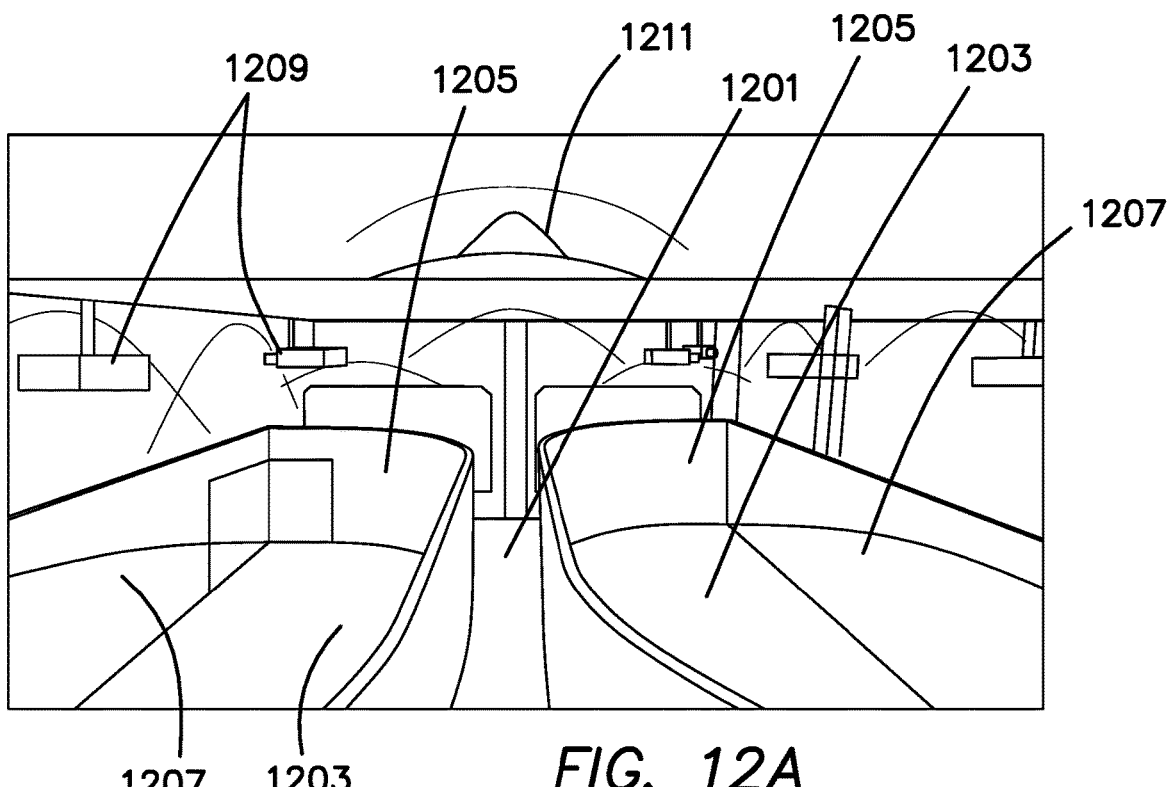
FIG. 12 A shows a rendering of another enclosure configuration, in which two semi pill-shaped internal spaces each comprise an external wall having a mirrored internal surface, and have a hallway between them.

FIG. 12A shows a rendering at ceiling level of a rectangular room containing two semi-pill shaped interior spaces 1203 with a hallway 1201 between them. Each of the enclosures 1203 comprises a mirrored internal surface of an exterior wall 1207, and a projection surface 1205 upon which is projected nature scenes from projectors 1209 and "UFO" projector array 1211.

Figure 12B:
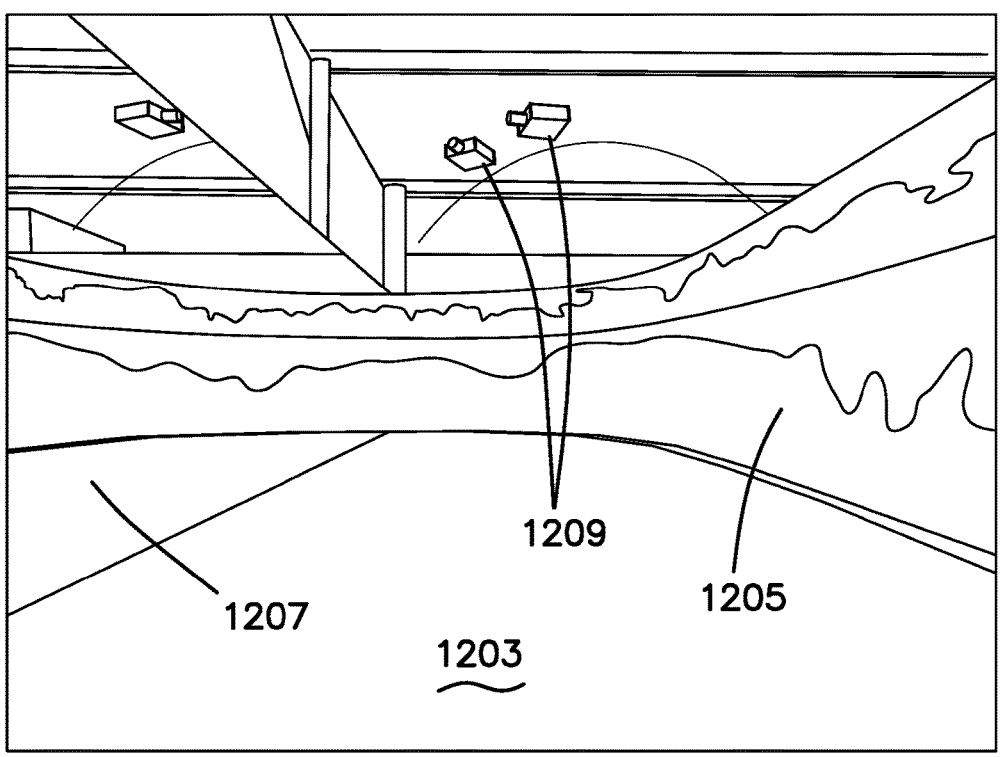

FIG. 12B shows a view from ground level within one of the semi-pill shaped interior spaces 1203 of FIG. 12A.

Figure 13A:
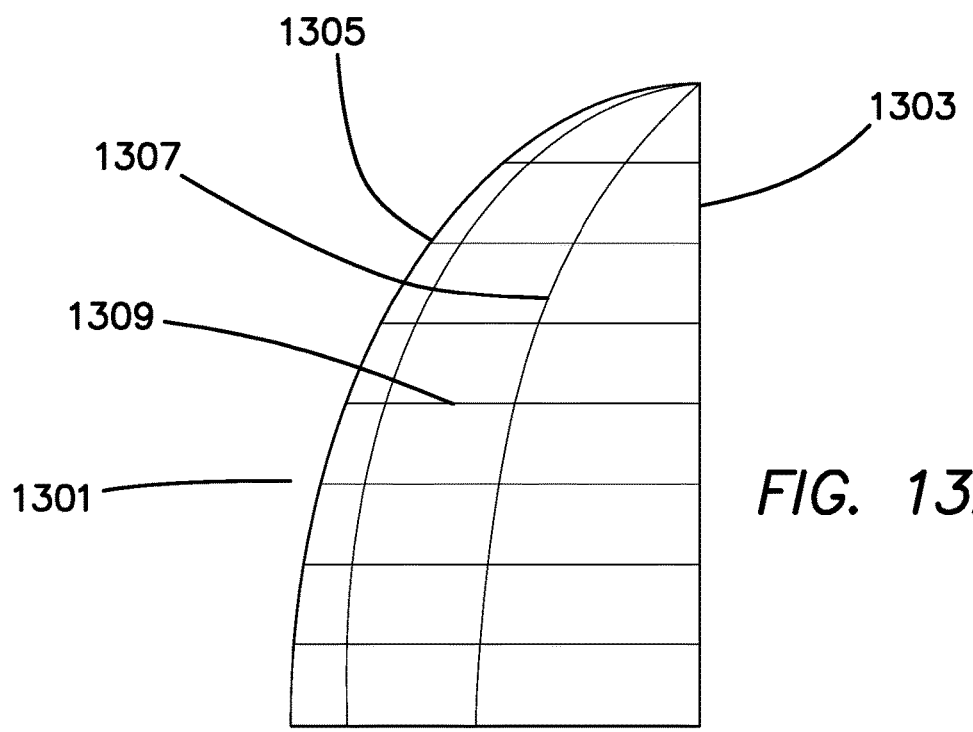
FIG. 13A is a schematic side view of an embodiment of a half-dome enclosure of the present invention.
Figure 13B:
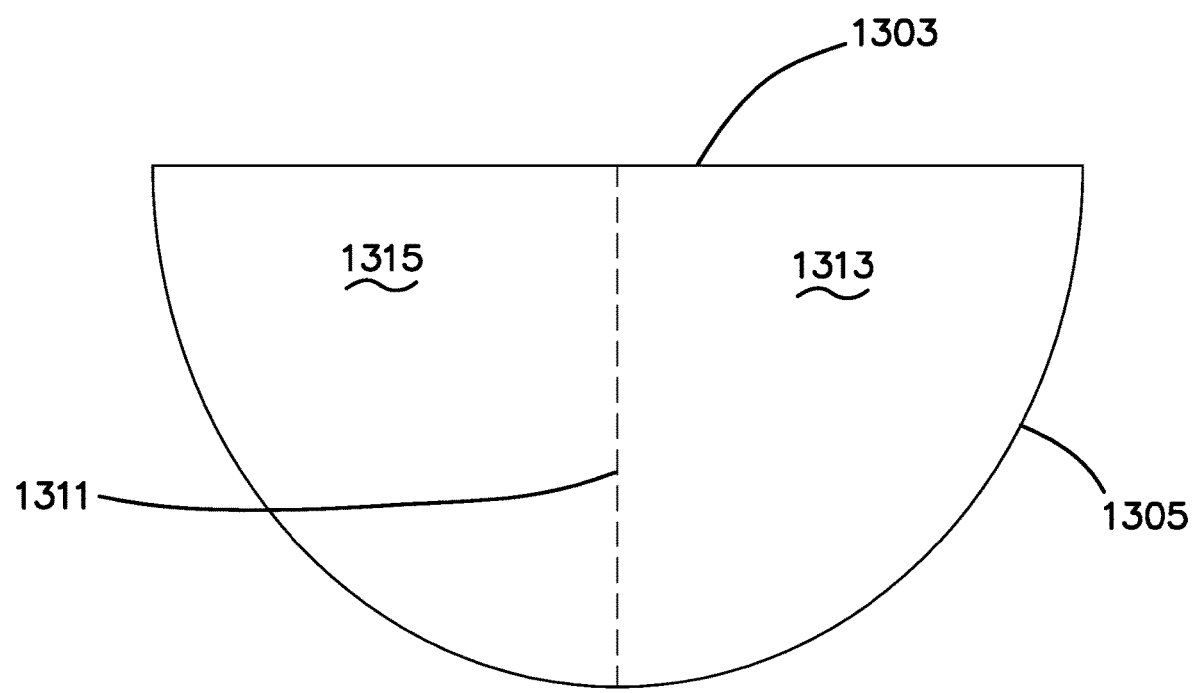
FIG. 13B is a schematic plan view of an embodiment of a half-dome enclosure of the present invention.

FIG. 13A shows a side view and FIG. 13B shows a plan view schematic of a half dome enclosure 1301. The vertical frame of the half dome may be made using a steel contour track material, as shown (1307) which may be customized to any size. Horizontal spreader members 1309 may comprise metallic members as well. However, in other embodiments the frame members may be made of a polymer or wood. And horizontal spreader frame elements may not be present in certain embodiments. The exterior surface of the enclosure 1305 may be made of any suitable material, including polycarbonate, thin dry wall, plywood, fabric, sheet metal, and the like. A mirrored wall 1303 forms one side of the half dome enclosure. In some embodiments one or more additional singly or doubly mirrored interior walls 1311 may subdivide the interior space of the enclosure into two or more separate volumes 1315.

Figure 14A:
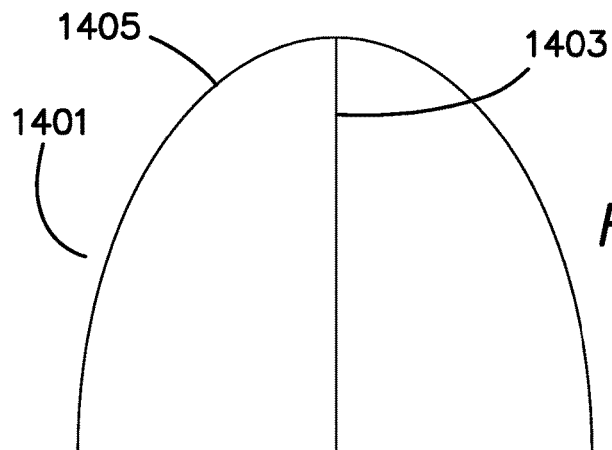
FIG. 14A is a schematic side view of an embodiment of a dome-shaped enclosure of the present invention.
Figure 14B:
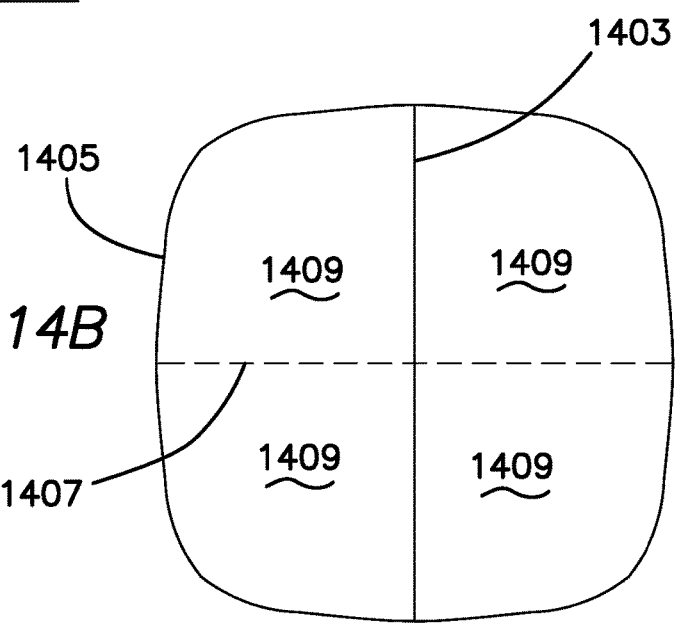
FIG. 14B is a schematic plan view of an embodiment of a dome-shaped enclosure of the present invention.
Figure 14C:
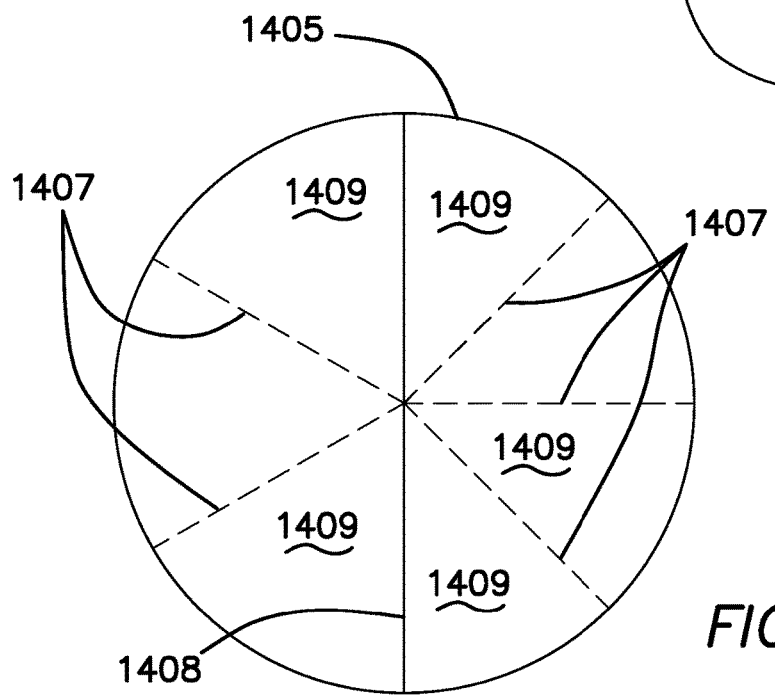
FIG. 14C is a schematic plan view of another embodiment of a dome-shaped enclosure of the present invention.

FIG. 14A shows a side view and FIG. 14B shows a plan view schematic of an embodiment of a dome enclosure 1401. As with the half dome enclosures shown in FIGS. 13A and 13B the frame may be made using a steel contour track material, which may be customized to any size. Horizontal spreader members may comprise metallic members as well. However, in other embodiments the frame members may be made of a polymer or wood. Horizontal spreader frame elements may not be present in certain embodiments. The exterior surface of the enclosure 1405 may be made of any suitable material, including polycarbonate, thin dry wall, plywood, fabric, sheet metal, and the like. A mirrored wall 1403 bisects forms one side of the dome enclosure. In some embodiments one or more additional singly or doubly mirrored interior walls 1407 may subdivide the interior space of the enclosure into three or more separate volumes 1409. FIG. 14C shows a plan view of an embodiment in which multiple interior volumes 1409 are created using multiple additional singly or doubly mirrored walls 1407. Projectors and/or projector arrays (not shown) are generally centrally located, and project visual images against the interior-facing projection surfaces of the exterior dome wall.

Figure 15A:
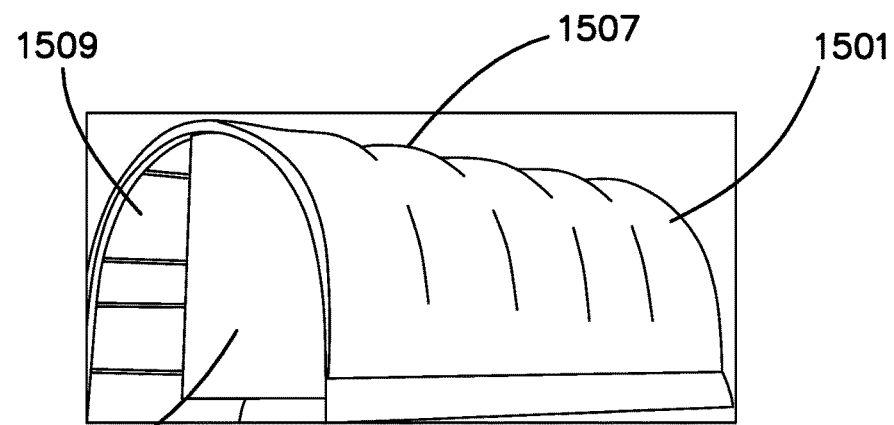
FIG. 15A is an oblique side view of a "tunnel" shaped enclosure of the present invention.

FIG. 15A is an oblique side view of a "tunnel" shaped enclosure 1501 comprising a double mirrored interior wall 1503 running lengthwise along the interior of the tunnel, and dividing the tunnel into separate interior spaces. The enclosure has a fabric exterior "wall" covering 1507, which may be erected over a wire or metal frame 1509. Projectors or projector arrays (not shown) are aligned to project visual images against the interior projection surfaces of the exterior tunnel wall covering 1507.

Figure 15B:
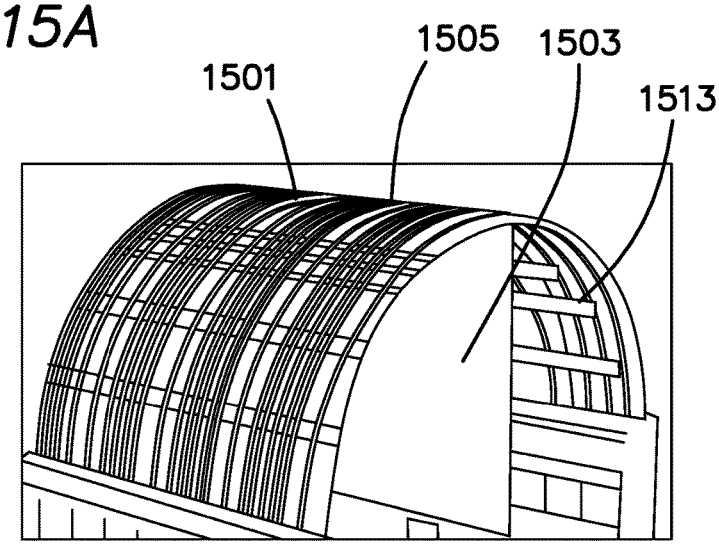
FIG. 15B is an oblique side view showing the frame of another embodiment of a "tunnel" shaped enclosure of the present invention.

FIG. 15B is an oblique side view showing the frame of another embodiment of a "tunnel" shaped enclosure 1501 comprising a double mirrored interior wall 1503 running lengthwise along the interior of the tunnel, and dividing the tunnel into separate interior spaces. The frame of the tunnel may be made using a steel contour track material 1505 erected over horizontal metal slatting 1513. As before, projectors or projector arrays (not shown) are aligned to project visual images against the interior projection surfaces of the exterior tunnel wall covering.

Figure 15C:
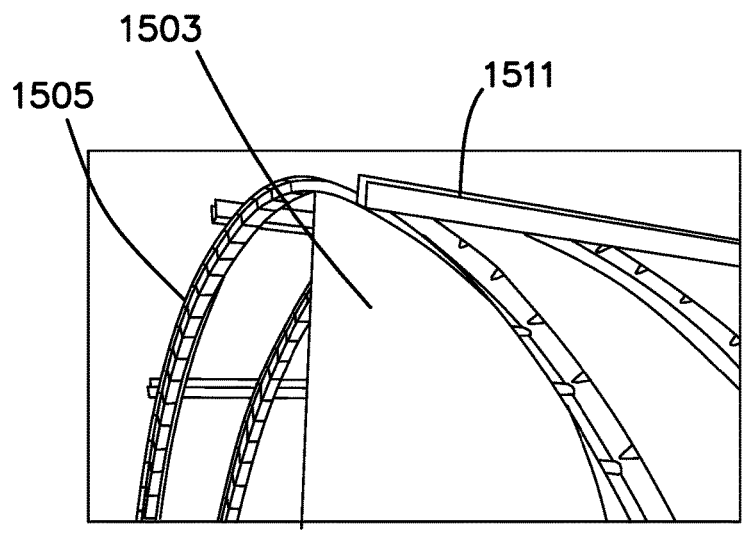
FIG. 15C is a close-up of the frame of another embodiment of a "tunnel" shaped enclosure of the present invention.

FIG. 15C is a close-up of the frame of another embodiment of a "tunnel" shaped enclosure comprising a double mirrored interior wall 1503 running lengthwise along the interior of the tunnel, and dividing the tunnel into separate interior spaces. This framing comprises a contour track metal frame 1505 joined by horizontal metal spacers 1511.

Figure 16A:
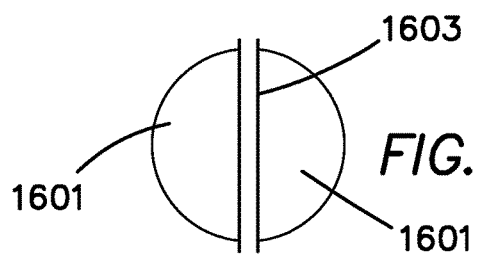
FIG. 16A shows an example of a circular enclosure plan view, with a hallway defining two interior spaces.

FIG. 16A shows an example of a circular enclosure plan view, with a hallway 1603 bisecting the circular enclosure and creating two interior spaces 1601, and having a mirrored surface facing the interior of each interior space 1601.

Figure 16B:
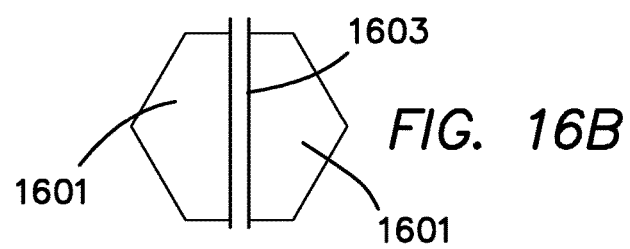
FIG. 16B shows an example of a hexagonal enclosure plan view, with a hallway defining two interior spaces.

FIG. 16B shows an example of a hexagonal enclosure plan view, with a hallway 1603 bisecting the enclosure and creating two interior spaces 1601, and having a mirrored surface facing the interior of each interior space 1601.

Figure 16D:
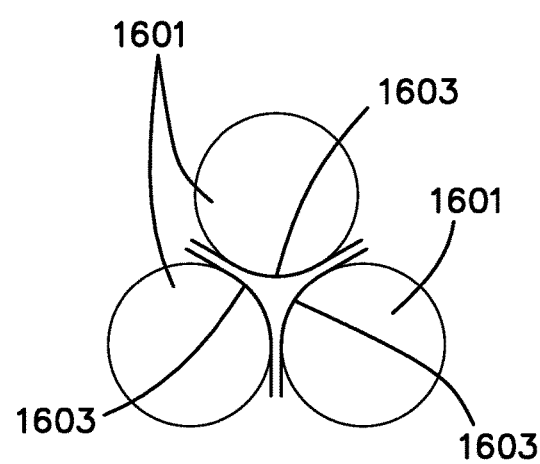
FIG. 16D shows an example of a trefoil enclosure plan view, with hallways defining three interior spaces.
Figure 16C:
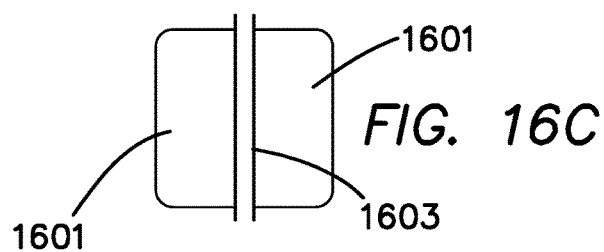
FIG. 16C shows an example of a roughly rectangular enclosure plan view, with a hallway defining two interior spaces.

FIG. 16C shows an example of a roughly rectangular enclosure plan view, with a hallway 1603 bisecting the enclosure and creating two interior spaces 1601, and having a mirrored surface facing the interior of each interior space 1601.

FIG. 16D shows an example of a trefoil enclosure plan view, with a hallway 1603 creating three interior spaces 1601, and having mirrored surfaces facing the interior of each interior space 1601.

Figure 17:
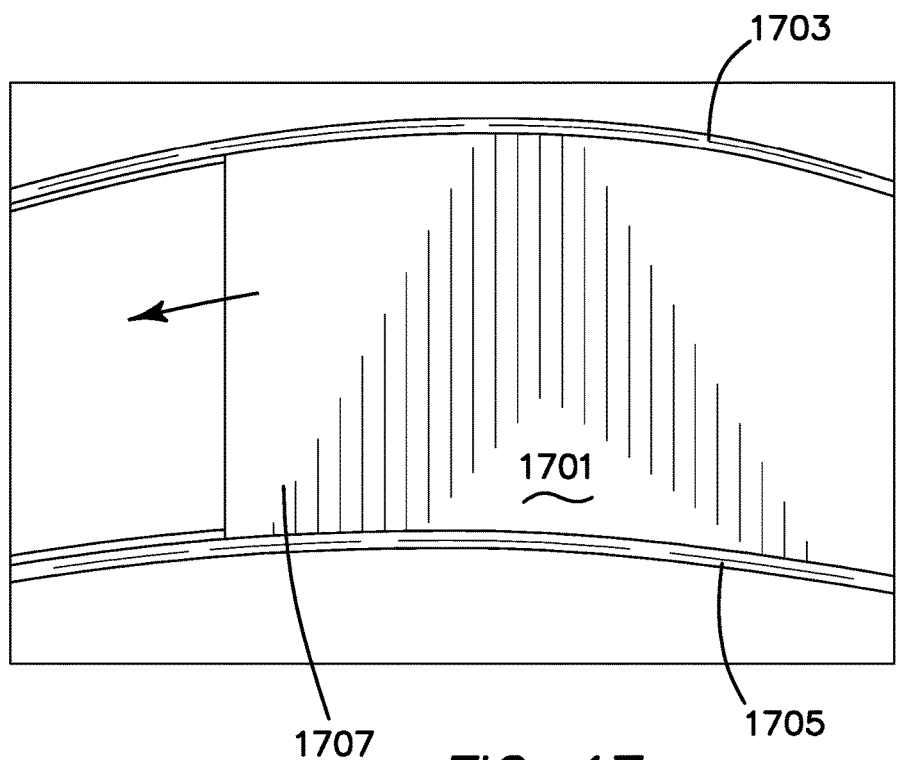
FIG. 17 shows another embodiment of the enclosure of the present invention, wherein the enclosure is formed within a room, by stretching a fabric or sheet material between ceiling tracks and floor tracks within the room.

FIG. 17 shows yet another embodiment of the enclosure of the present invention, wherein the enclosure is formed within a room, by locating ceiling tracks 1703 and floor tracks 1705 within the room, then stretching a curtain, screen or fabric 1707 comprising a projection surface between the floor and ceiling, preferably in a curved alignment. Projectors may be located or suspended from the ceiling or mounted on a portable holder that may be positioned to project images against the projection surface. A mirror or mirrored film or fabric may also be stretched or erected substantially perpendicularly to the floor and ceiling to reflect the images projected on the projection surface.

To the extent that a plurality of inventions are disclosed herein, any such invention shall be understood to have disclosed herein alone, in combination with other features or inventions disclosed herein, or lacking any feature or features not explicitly disclosed as essential for that invention. For example, the inventions described in this specification can be practiced within elements of, or in combination with, other any features, elements, methods or structures described herein. Additionally, features illustrated herein as being present in a particular example are intended, in other examples of the present invention, to be explicitly lacking from the invention, or combinable with features described elsewhere in this patent application, in a manner not otherwise illustrated in this patent application or present in that particular example. The scope of the invention shall be determined solely by the language of the claims.

Thus, the various descriptions of the invention provided herein illustrate presently preferred examples of the invention; however, it will be understood that the invention is not limited to the examples provided, or to the specific configurations, shapes, and relation of elements unless the claims specifically indicate otherwise. Based upon the present disclosure a person of ordinary skill in the art will immediately conceive of other alternatives to the specific examples given, such that the present disclosure will be understood to provide a full written description of each of such alternatives as if each had been specifically described.

What is claimed is:

1. A wellness studio comprising a polygonal room comprising straight walls and containing:

a) a first enclosure comprising a first wall and a second wall, said first wall having a height of about 9 feet or greater and having an interior surface that is substantially continuous and curved and comprises a first end and a second end; said second wall having a height of about 9 feet or greater and being substantially straight, and comprising a third end joined to the first end of the first wall and a fourth end joined to the second end of the first wall to define a first interior space, and a mirrored interior surface extending from the third end to the fourth end thereof, said first enclosure comprising a doorway providing access from outside said first enclosure to the first interior space;

b) a second enclosure comprising a third wall and a fourth wall, said third wall having a height of about 9 feet or greater and having an interior surface that is substantially continuous and curved and comprises a fifth end and a sixth end; said fourth wall having a height of about 9 feet or greater and being substantially straight, and comprising a seventh end joined to the fifth end of the third wall and a eighth end joined to the sixth end of the third wall to define a second interior space, and a mirrored interior surface extending from the seventh end to the eighth end thereof, said second enclosure comprising a doorway providing access from outside said second enclosure to the second interior space; the interior surfaces of the first wall and the third wall each comprising a projection surface extending from the first end to the second end of the first wall and from the fifth end to the sixth end of the third wall;

c) a hallway defined between the first enclosure and the second enclosure;

d) a first projector component adapted to display a visual image upon the curved projection surface of the first wall from the first end to the second end thereof, thereby creating a virtually seamless image projected completely around the curved projecting surface of the first wall; and e) a second projector component structured to display a visual image upon the curved projection surface of the third wall from the fifth end to the sixth end thereof, thereby creating a virtually seamless single image projected completely around the curved projecting surface of the third wall; and f) a client reception area located within said wellness studio and at least partially defined by outer surfaces of said first enclosure, said second enclosure and inside surfaces of said polygonal room; said client reception area comprising client seating and merchandise selected from the group consisting of health drinks, books, candles, and incense, and;

wherein plan views of each of the first interior space and the second interior space each have a shape selected from the group consisting of semi-circular, semi-oval, semi-elliptical, semi-Cassini oval, and semi-pill-shaped, and the plan view shape of the first interior space is a mirror image of the plan view shape of the second interior space.

2. The wellness studio of claim 1 in which the first projector component and the second projector component are located in a common housing.

3. The wellness studio of claim 1 in which the hallway is defined between exterior surfaces of either a) the substantially straight second wall of the first enclosure and the substantially straight fourth wall of the second enclosure, or b) the substantially continuous and curved first wall of the first enclosure and the substantially continuous and curved third wall of the second enclosure.

4. The room of claim 1 in which at least one of the first projector component and the second projector component is mounted at an elevation above the interior walls of said first enclosure and said second enclosure.

5. The wellness studio of claim 1 in which both said first projector component and said second projector component are mounted at an elevation above the interior walls of said first enclosure and said second enclosure.

6. The wellness studio of claim 5 in which the first projector component and the second projector component are the same projector component.

7. The wellness studio of claim 1 wherein either a) said first wall of first enclosure and said third wall of said second enclosure, or b) said second wall of first enclosure and said fourth wall of said second enclosure each comprises a door defined therein leading from an interior space to a location exterior to either said first or second enclosure.

8. The wellness studio of claim 1 wherein the plan view of each of the first interior space and the second interior space is pill-shaped.

9. The wellness studio of claim 1 in which at least one of said first projector component and said second projector component is structured to store image files and display virtual images on a projection surface.

\* \* \* \* \*